United States Patent
Sukekawa

(10) Patent No.: US 10,818,665 B2
(45) Date of Patent: Oct. 27, 2020

(54) ARRAY OF RECESSED ACCESS DEVICES AND AN ARRAY OF MEMORY CELLS INDIVIDUALLY COMPRISING A CAPACITOR AND A TRANSISTOR

(71) Applicant: Micron Technology, Inc., Boise, ID (US)

(72) Inventor: Mitsunari Sukekawa, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 245 days.

(21) Appl. No.: 16/111,781

(22) Filed: Aug. 24, 2018

(65) Prior Publication Data

US 2020/0066727 A1   Feb. 27, 2020

(51) Int. Cl.
  *H01L 27/108* (2006.01)
  *H01L 21/266* (2006.01)
  *H01L 21/265* (2006.01)

(52) U.S. Cl.
  CPC .. *H01L 27/10823* (2013.01); *H01L 27/10814* (2013.01); *H01L 27/10855* (2013.01); *H01L 27/10876* (2013.01); *H01L 27/10891* (2013.01); *H01L 21/266* (2013.01); *H01L 21/26513* (2013.01); *H01L 27/10885* (2013.01); *H01L 27/10888* (2013.01)

(58) Field of Classification Search
  CPC ......... H01L 27/10823; H01L 27/10814; H01L 27/10855
  See application file for complete search history.

(56) References Cited

U.S. PATENT DOCUMENTS

| 10,103,053 | B1 | 10/2018 | Sukekawa | |
|---|---|---|---|---|
| 2006/0113587 | A1 | 6/2006 | Thies et al. | |
| 2006/0216894 | A1 | 9/2006 | Parekh et al. | |
| 2006/0240634 | A1 | 10/2006 | Tran | |
| 2010/0066440 | A1 | 3/2010 | Juengling | |
| 2011/0220994 | A1 | 9/2011 | Parekh et al. | |
| 2011/0223726 | A1* | 9/2011 | Kim | H01L 27/108 438/151 |
| 2015/0028406 | A1* | 1/2015 | Tang | H01L 29/0653 257/296 |
| 2016/0197084 | A1* | 7/2016 | Yoon | H01L 21/31111 438/270 |

FOREIGN PATENT DOCUMENTS

WO     WO   7/2019
  PCT/US2019/025935

* cited by examiner

*Primary Examiner* — Errol V Fernandes
(74) *Attorney, Agent, or Firm* — Wells St. John P.S.

(57) ABSTRACT

An array of recessed access devices comprises islands comprising semiconductive material surrounded by insulating material. The insulating material has a bottom adjacent individual of the islands. Rows of transistor gate lines individually cross multiple of the islands within the semiconductive material and cross within the insulating material between the individual islands. Individual of the gate lines are operatively adjacent a channel region of individual of the transistors within the individual islands and interconnect the transistors in that row. The individual transistors comprise a pair of source/drain regions on opposite sides of the individual gate lines in the individual islands. A lower portion of the individual islands proximate individual of the bottoms of the insulating material has less horizontal area than an uppermost portion of the individual islands. Additional embodiments are disclosed.

27 Claims, 26 Drawing Sheets

ARRAY OF RECESSED ACCESS DEVICES AND AN ARRAY OF MEMORY CELLS INDIVIDUALLY COMPRISING A CAPACITOR AND A TRANSISTOR

TECHNICAL FIELD

Embodiments disclosed herein pertain to arrays of recessed access devices and to arrays of memory cells individually comprising a capacitor and a transistor.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

A recessed access device is a type of field effect transistor having its gate construction buried within a trench formed in semiconductive material. The gate construction includes a gate insulator which lines the trench and conductive gate material within the trench laterally inward of the gate insulator. A source/drain region is formed in outermost regions of the semiconductive material on each of opposing sides of the trench. When the two source/drain regions are at different voltages and a suitable voltage is applied to the conductive gate material, current ($I_{on}$) flows through the semiconductive material between the source/drain regions typically along the trench sidewalls and typically around the base of the trench (i.e., a conductive channel region forms through which current flows between the two source/drain regions). Recessed access devices may be provided in arrays comprising memory circuitry and in arrays not necessarily comprising memory circuitry.

Regardless, a continuing goal in fabrication of memory and other circuitry is to make ever-smaller and closer-spaced components. This of course reduces the size of parts of those components. Further, as the components are placed closer together, undesired parasitic capacitance and/or cross-talk between immediately-adjacent components may occur.

While the invention was motivated in overcoming some problems as identified above, the invention is in no way so limited, nor is it everywhere limited to fabrication of memory circuitry.

DETAILED DESCRIPTION OF EXAMPLE EMBODIMENTS

Figure 1:
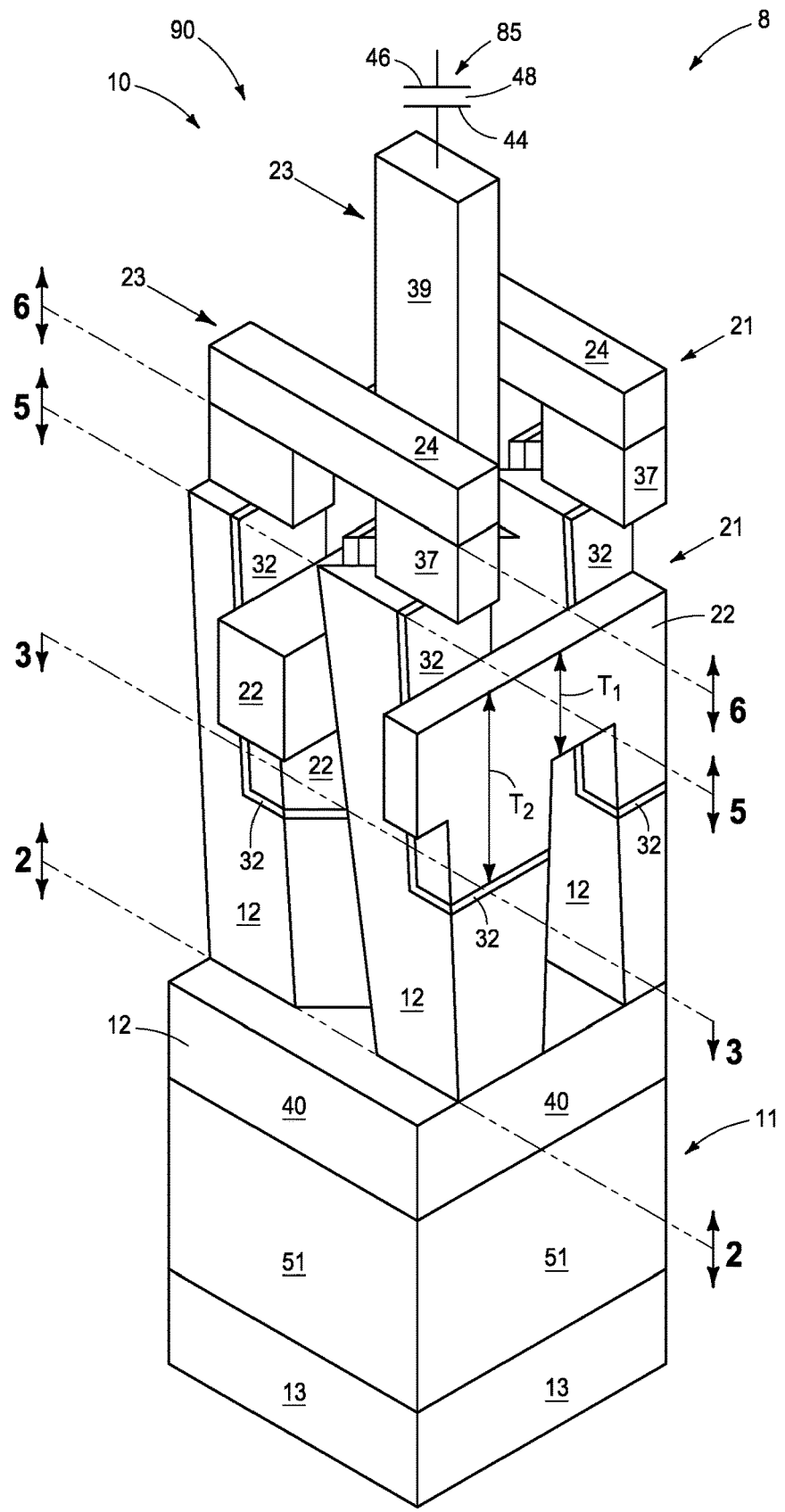
FIG. 1 is a diagrammatic perspective view of a portion of an integrated circuitry construction in accordance with an embodiment of the invention.
Figure 2:
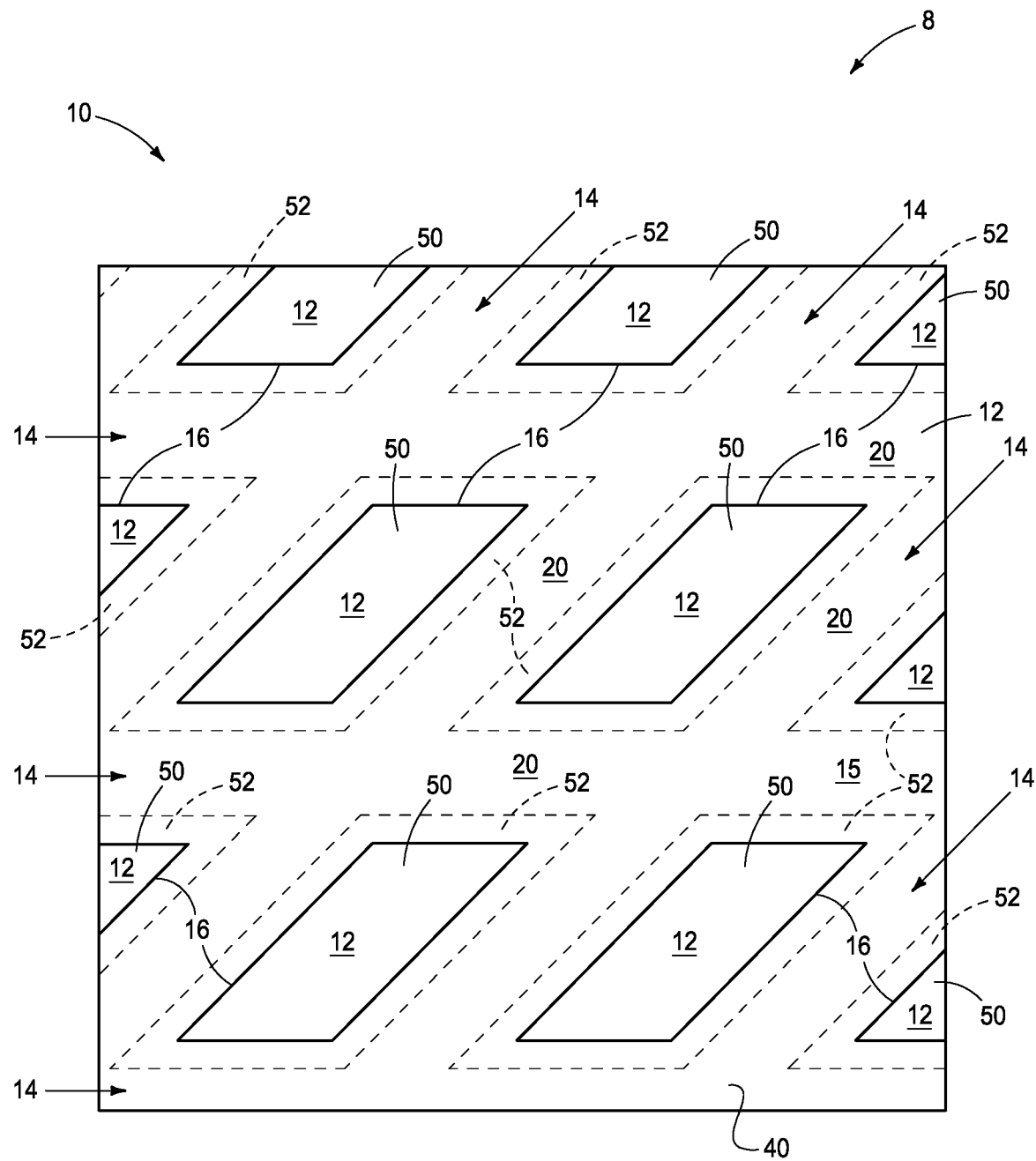
FIG. 2 is a view taken through line 2-2 in FIG. 1.
Figure 3:
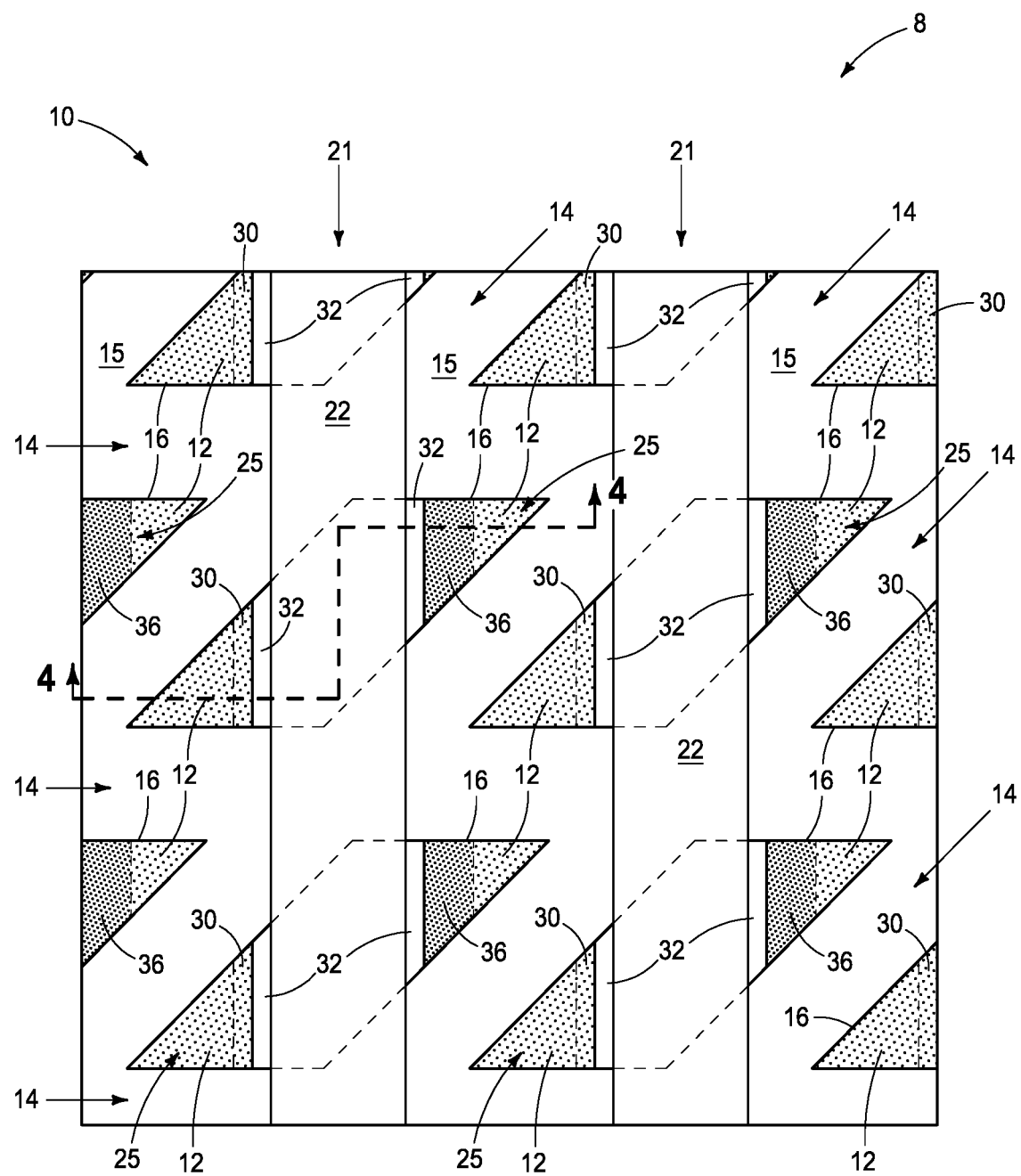
FIG. 3 is a view taken through line 3-3 in FIG. 1.
Figure 4:
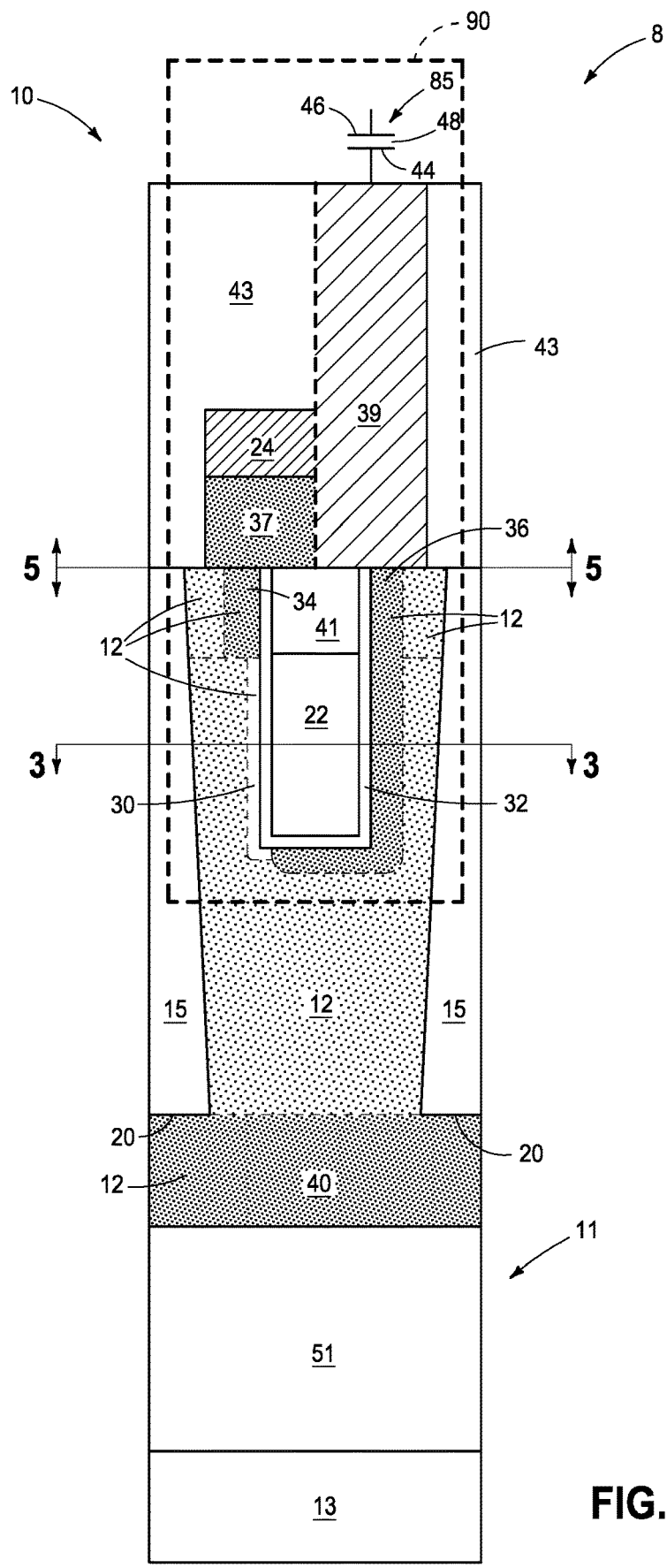
FIG. 4 is an enlarged view taken through line 4-4 in FIGS. 3 and 5.
Figure 5:
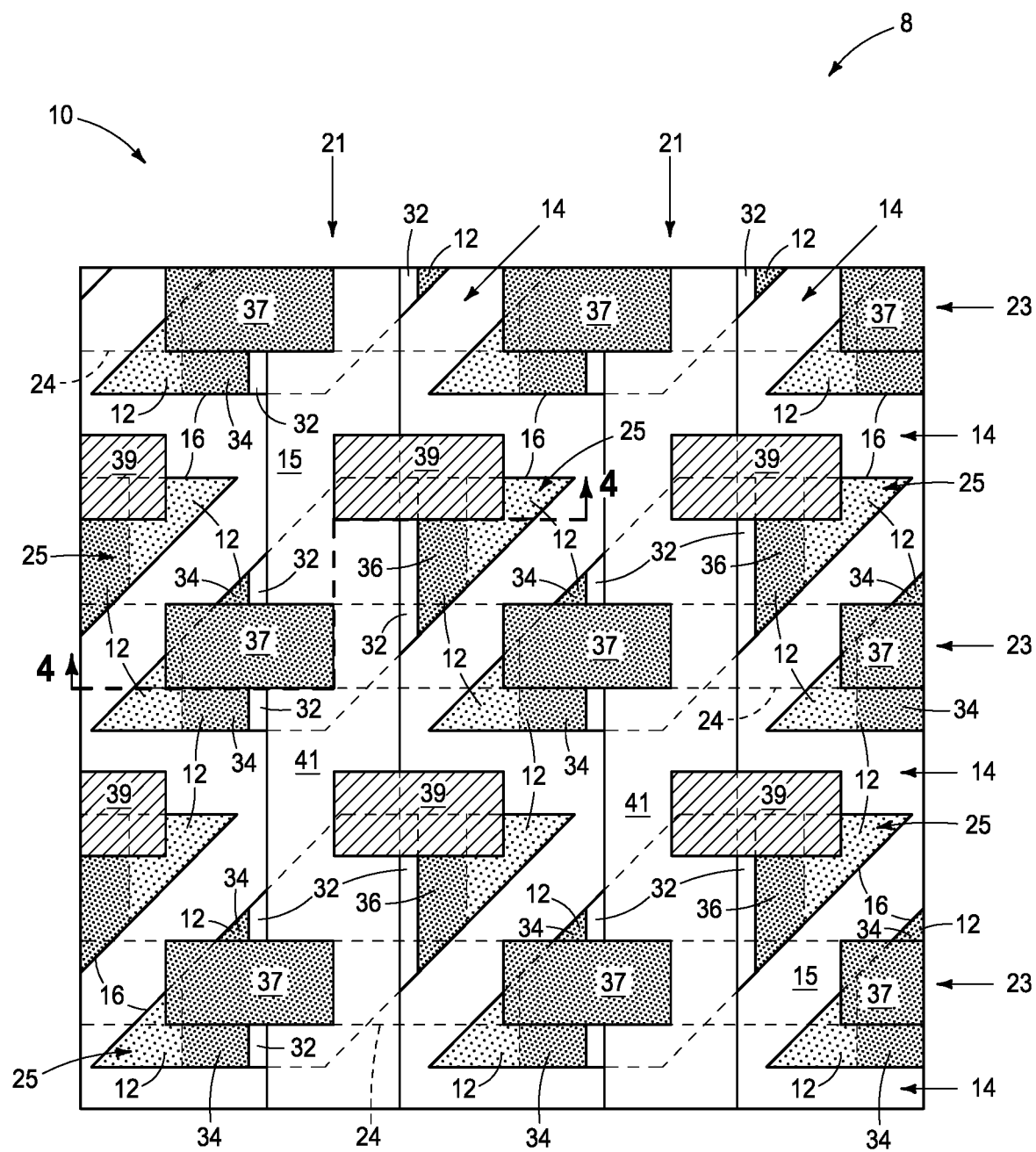
FIG. 5 is a view taken through line 5-5 in FIG. 1.

Embodiments of the invention encompass an array of recessed access devices, for example as may be in any existing or future-developed memory or other circuitry. Embodiments of the invention also encompass an array of memory cells as may be in any existing or future-developed memory circuitry. A first example embodiment is shown in and described with reference to FIGS. 1-6. Such includes a substrate structure or construction 8 comprising an array 10 of memory cells 90 (FIGS. 1 and 4) provided relative to a base substrate 11 (FIGS. 1, 2, and 4). Memory cells 90 individually comprise a storage element 85 (e.g., a capacitor) (FIGS. 1 and 4) and a transistor 25 (FIGS. 3 and 5). Memory cells 90 may be DRAM memory cells, which in the example embodiment are 1T-1C. Alternately, the memory cells may individually be 2T-1C, 2T-1C, 3T-1C, etc. DRAM or other memory cells and whether existing or future-developed. Base substrate 11 may comprise any one or more of conductive/conductor/conducting (i.e., electrically herein), semiconductive/semiconductor/semiconducting, and insulative/insulator/insulating (i.e., electrically herein) materials. Various materials are elevationally over base substrate 11. Materials may be aside, elevationally inward, or elevationally outward of the FIGS. 1-6—depicted materials. For example, other partially or wholly fabricated components of integrated circuitry may be provided somewhere above, about, or within base substrate 11. Control and/or other peripheral circuitry for operating components within a memory array may also be provided and may or may not be wholly or partially within a memory array or sub-array. Further, multiple sub-arrays may also be fabricated and operated independently, in tandem, or otherwise relative one another. As used in this document, a "sub-array" may also be considered as an array.

Figure 5A:
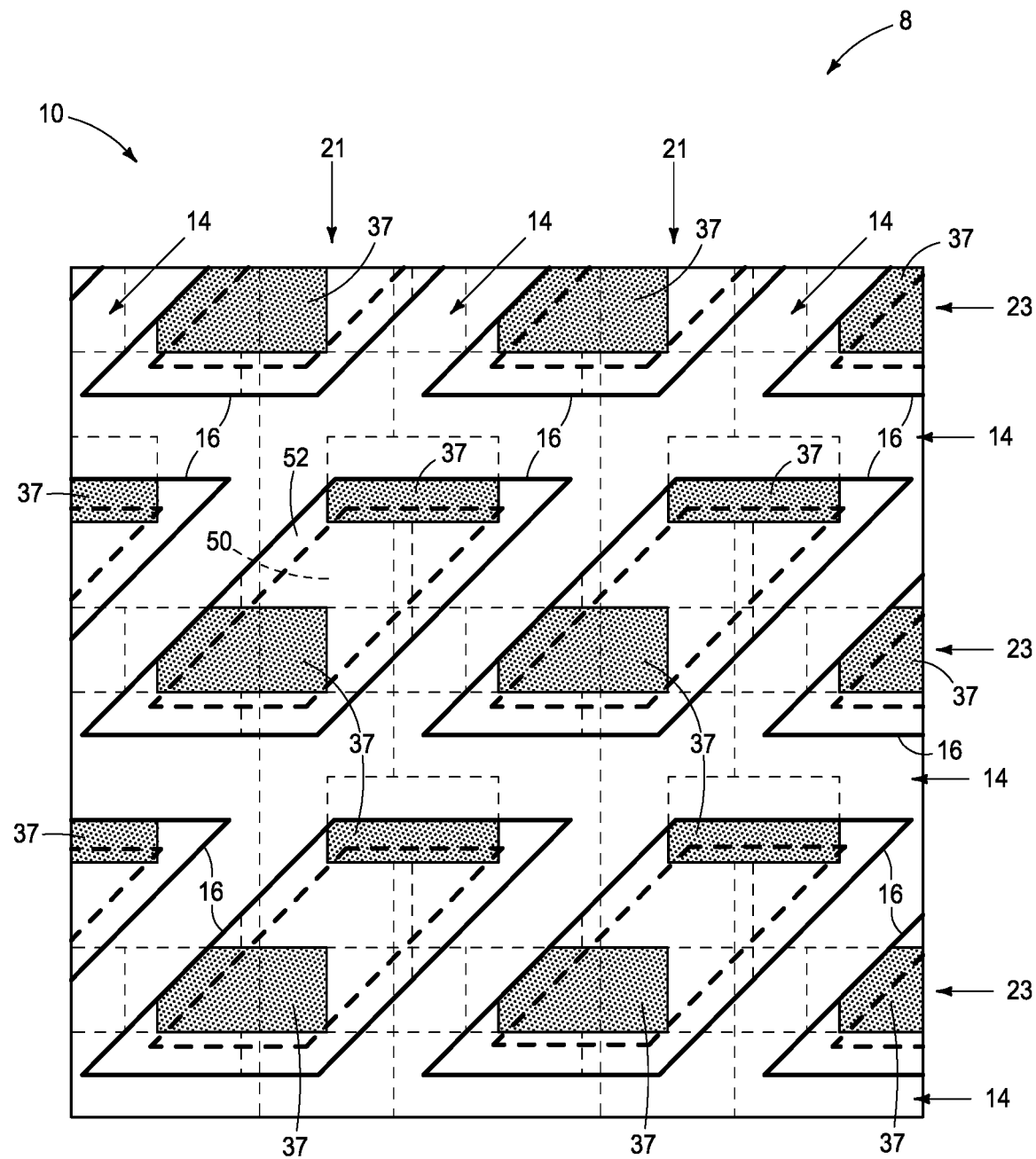
FIG. 5A is a view taken through line 5-5 in FIG. 1 that emphasizes and deemphasizes certain features in comparison to those shown in FIG. 5.
Figure 6:
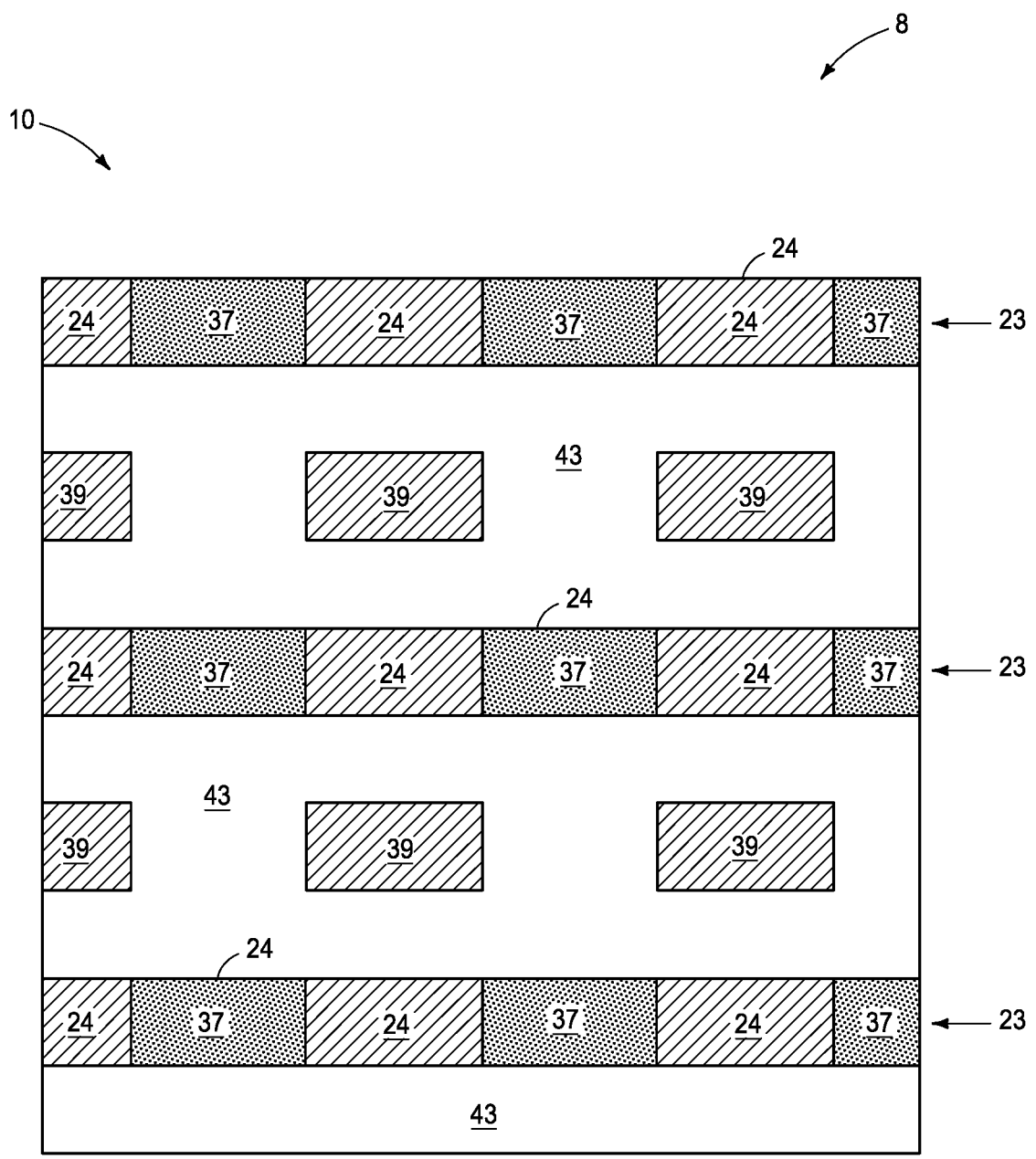
FIG. 6 is a view taken through line 6-6 in FIG. 1.

Base substrate 11 comprises semiconductive material 12 (e.g., appropriately and variously doped monocrystalline and/or polycrystalline silicon, Ge, SiGe, GaAs, and/or other existing or future-developed semiconductive material), trench isolation regions 14 (i.e., comprising insulating material 15; e.g., example silicon nitride and/or silicon dioxide), and active area regions 16 comprising suitably and variously-doped semiconductive material 12. Insulating material 15 is not shown in FIG. 1 for clarity of example operative components as described below. The active area regions are islands 16 comprising semiconductive material 12 and that are individually surrounded by insulting material 15. FIG. 5A is the same as FIG. 5, with islands 16 being shown with wider black lines in FIG. 5A for emphasis thereof, and with the exclusion of most all other numerals for clarity. Example islands 16 are shown as individually being slanted parallelograms in horizontal cross-section, although any existing or future-developed alternate shapes may be used. Insulative material 15 may be considered as having a bottom 20 (FIGS. 2 and 4) adjacent individual islands 16 (e.g., two bottoms 20 in vertical cross-section relative to individual islands 16 [FIG. 4] or one bottom 20 encircling individual islands 16 in horizontal cross-section [FIG. 2, with only one such bottom 20 being so designated with four numerals 20 for clarity in FIG. 2]). Example construction 8 is shown as comprising insulative material 51 (e.g., silicon dioxide and/or silicon nitride) atop a base material 13 (e.g., monocrystalline silicon).

Array 10 comprises rows 21 of wordlines 22 and columns 23 of digitlines 24. Use of "row" and "column" in this document is for convenience in distinguishing one series of lines from another series of lines. Accordingly, "row" and "column" are intended to be synonymous with any series of lines independent of function. Regardless, the rows may be straight and/or curved and/or parallel and/or not parallel relative one another, as may be the columns. Further, the rows and columns may intersect relative one another at 90° or at one or more other angles. In the depicted example, each of the row lines and column lines are shown as being individually straight and angling relative one another at 90°. The wordlines and digitlines may comprise any suitable metal material and/or conductively-doped semiconductive material.

Individual rows 21 comprise an individual wordline 22 crossing multiple of islands 16 within semiconductive material 12. Insulative material 41 (FIGS. 4 and 5; e.g., silicon dioxide and/or silicon nitride) is atop wordline 22. Individual wordlines 22 are operatively adjacent a channel region 30 (FIGS. 3 and 4) of individual transistors 25 within individual islands 16 and interconnect the transistors 25 in that row 21. A gate insulator 32 (e.g., silicon dioxide and/or silicon nitride) is between wordlines 22 and channel regions 30. Semiconductive material 12 in individual transistors 25 comprises a pair of source/drain regions 34, 36 on opposite sides of individual wordlines 22 in individual islands 16. Each of source/drain regions 34, 36 comprises at least a part thereof having a conductivity-increasing dopant therein that is of maximum concentration of such conductivity-increasing dopant within the respective source/drain region 34, 36, for example to render such part to be conductive (e.g., having a maximum dopant concentration of at least $10^{19}$ atoms/cm$^3$). Accordingly, all or only a part of each source/drain region 34, 36 may have such maximum concentration of conductivity-increasing dopant. Source/drain regions 34 and/or 36 may include other doped regions (not shown), for example halo regions, LDD regions, etc.

In one embodiment, pair of source/drain regions 34, 36 are monocrystalline and in one embodiment channel regions 30 are monocrystalline. In one embodiment, one of the source/drain regions (e.g., 36) of the pair is all along one of the opposite sides (FIG. 4) of individual wordlines 22 in individual islands 16. In one embodiment, channel region 30 is along all of one (in one such embodiment along all of the other) of the opposite sides of individual wordlines 22 in individual islands 16.

In one embodiment, semiconductive material 12 interconnects islands 16 below bottoms 20 of insulating material 15. In one such embodiment, semiconductive material 12 comprises a polycrystalline region 40 that interconnects islands 16 below bottoms 20 of insulating material 15, and in one such embodiment polycrystalline semiconductive material 40 is conductively doped. Such a region/material 40 may be kept at any suitable potential during operation towards precluding voltage float of channel regions 30 in semiconductive material 12 and in semiconductive material 12 below channel regions 30 above material/region 40.

Individual columns 23 comprise an individual digitline 24 above wordlines 22. Digitline 24 is electrically coupled (e.g., directly through a conductive via 37) to one of the source/drain regions (e.g., 34) of individual transistors 25 and interconnects transistors 25 in that column 23.

Individual capacitors 85 (FIGS. 1 and 4) of individual memory cells 90 within array 10 individually comprise a lower electrode 44 electrically coupled (e.g., directly through a conductive via 39) to the other source/drain region (e.g., 36) of individual transistors 25, an upper electrode 46, and a capacitor insulator 48 between lower electrode 44 and upper electrode 46 (44, 46, and 48 being shown schematically in FIGS. 1 and 4). Insulative material 43 (FIGS. 4 and 6; e.g., silicon dioxide and/or silicon nitride) is about components 37, 39, and 24.

In one embodiment, a lower portion 50 (e.g., that portion 50 within the section cut 2-2 that is FIG. 2) of individual islands 16 proximate individual bottoms 20 of insulating material 15 has less horizontal area than an uppermost portion 52 (e.g., that portion 52 within the section cut 5-5 that is FIGS. 5 and 5A) of individual islands 16. Phantom outlines 50 and 52 are shown in FIGS. 5A and 2, respectively, for ease in comparing horizontal area of portions 50 and 52. Such an example increase in horizontal area in uppermost portion 52 may increase contact area for conductive via 39 to source/drain region 36 and thereby reduce contact resistance there-between. In one embodiment, individual wordlines 22 have a maximum vertical thickness $T_1$ (FIG. 1) within islands 16 that is greater than a maximum vertical thickness $T_2$ within insulating material 15 between islands 16 (FIG. 1). Such reduced thickness $T_2$ in comparison to $T_1$ may reduce noise, cross-talk, and/or parasitic capacitance between laterally-adjacent operative components. In one embodiment and as shown, array 10 comprises both of said horizontal area relationship of portions 50 and 52 and maximum vertical thickness relationship of $T_1$ and $T_2$.

Figure 7:
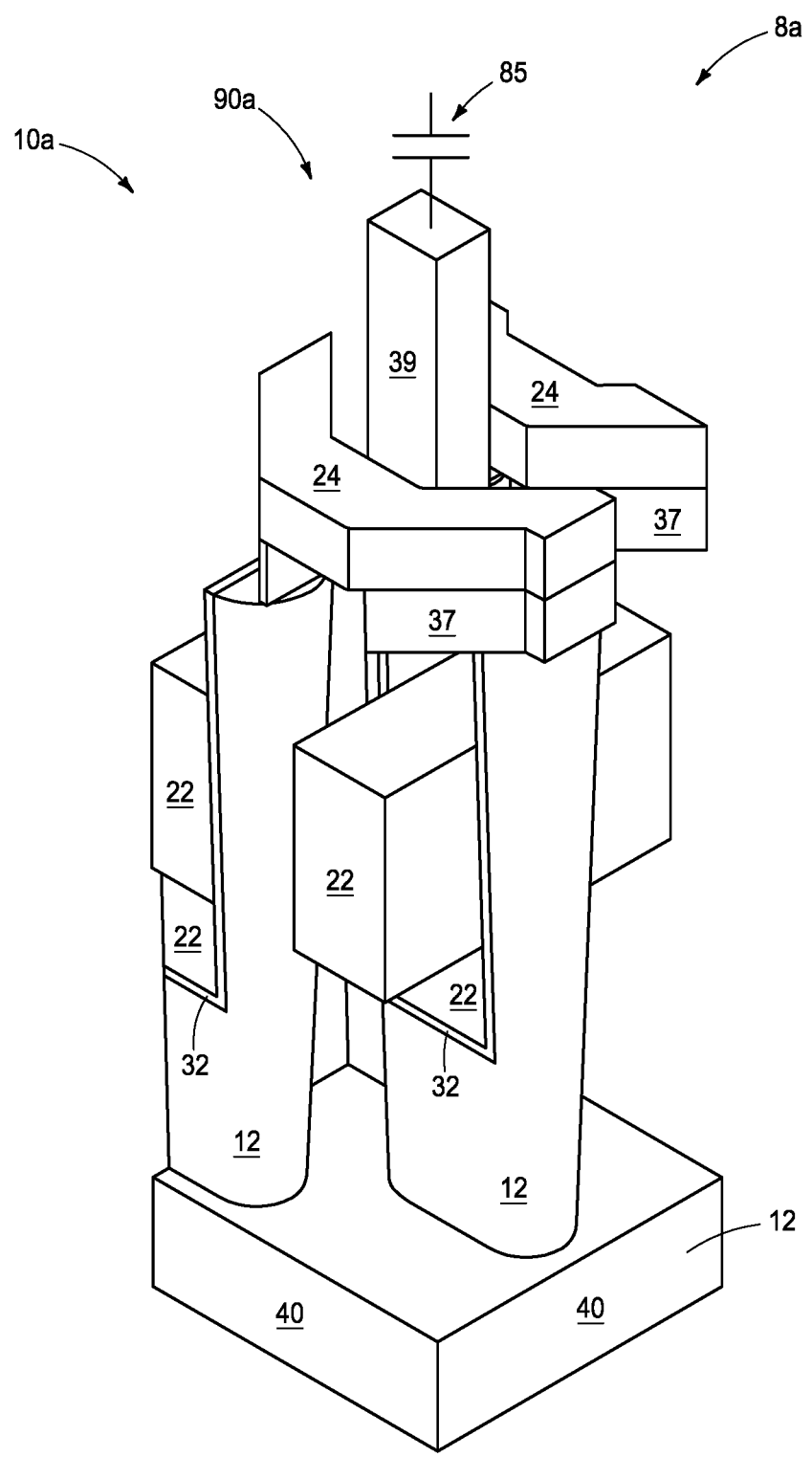
FIG. 7 is a diagrammatic perspective view of a portion of an integrated circuitry construction in accordance with an embodiment of the invention.
Figure 8:
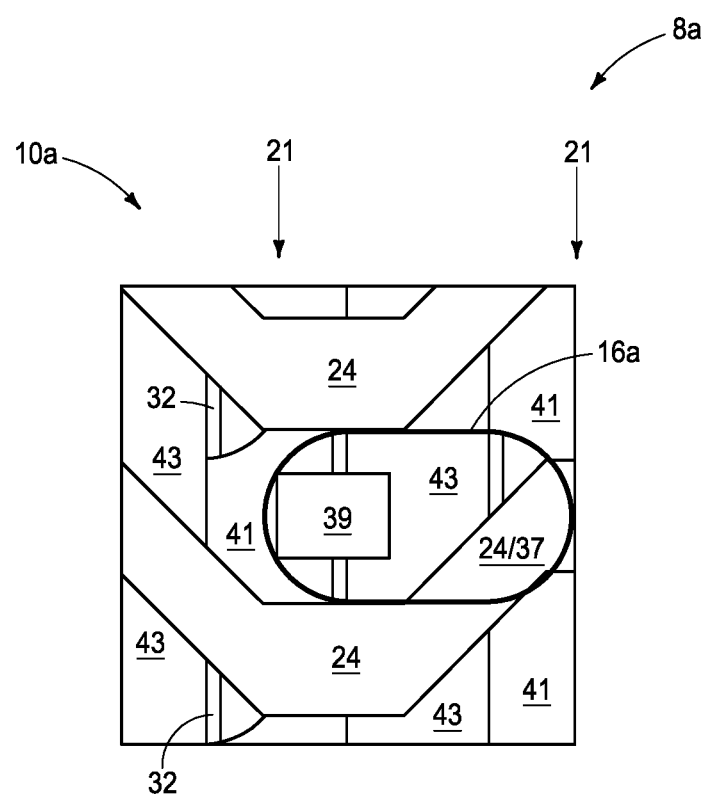
FIG. 8 is a diagrammatic top-down view of a portion of FIG. 7.

An alternate example embodiment construction 8a comprising an array 10a of memory cells 90a individually comprising a capacitor 85 and a transistor 25 is shown in FIGS. 7 and 8. Like numerals from the above-described embodiments have been used where appropriate, with some construction differences being indicated with the suffix "a". Such, by way of example, shows a different and perhaps a slightly denser layout than the first-described embodiments, and comprising slightly different shaped horizontal outlines of islands 16a. Any other attribute(s) or aspect(s) as shown and/or described herein with respect to other embodiments may be used.

Figure 9:
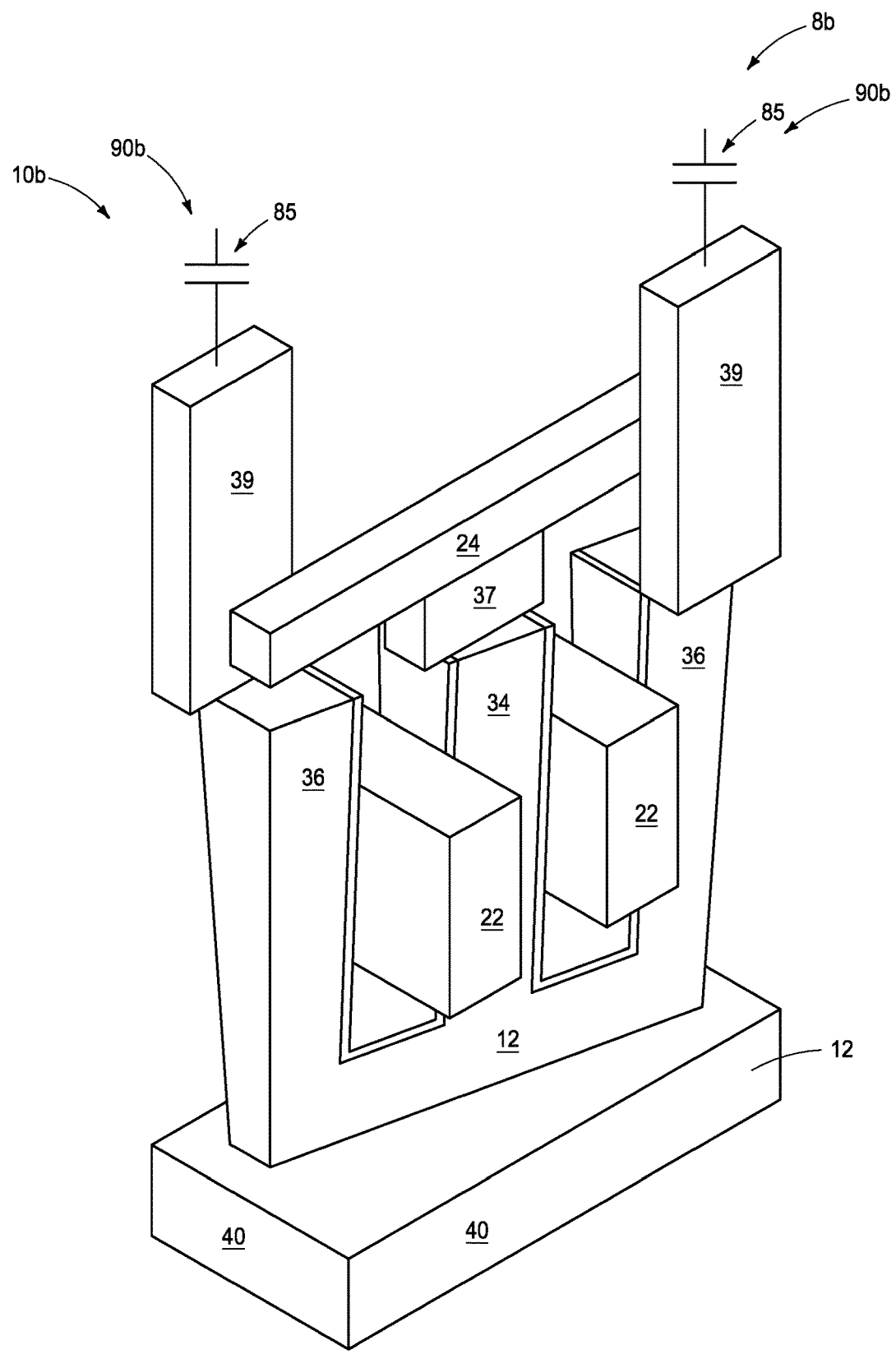
FIG. 9 is a diagrammatic perspective view of a portion of an integrated circuitry construction in accordance with an embodiment of the invention.
Figure 10:
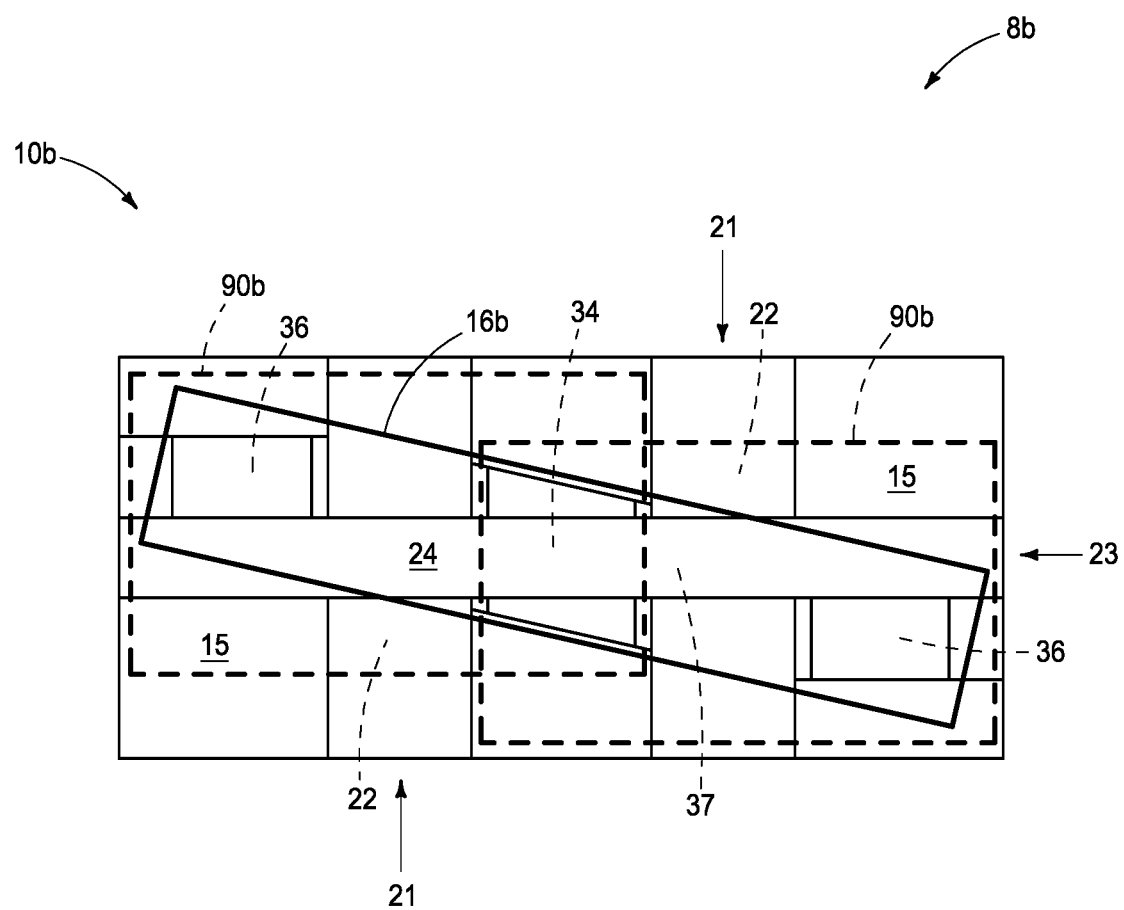
FIG. 10 is a diagrammatic top-down view of FIG. 9.

The above-described embodiments with respect to FIGS. 1-8 show but two examples individually wherein one and only one memory cell 90/90a is provided per island 16/16a, and regardless of whether such memory cell comprises only one transistor and only one capacitor. An alternate example embodiment construction 8b of an array 10b is shown in FIGS. 9 and 10 and comprises two and only two memory cells 90b per island 16b. Like numerals from the above-described embodiments have been used where appropriate, with some construction differences being indicated with suffix the "b". Islands 16b individually comprise two transistors 25, and in one embodiment which share one source/drain region (e.g., 34). Any other attribute(s) or aspect(s) as shown and/or described herein with respect to other embodiments may be used.

An embodiment of the invention comprises an array (e.g., 10, 10a, 10b) of recessed access devices (e.g., 25) regardless of whether being a part of existing or future-developed memory or other circuitry. Such an array comprises islands (e.g., 16, 16a, 16b) comprising semiconductive material (e.g., 12) surrounded by insulating material (e.g., 15). The insulating material has a bottom (e.g., 20) adjacent individual of the islands. Rows (e.g., 21) of transistor gate lines (e.g., 22) individually cross multiple of the islands within the semiconductive material and cross within the insulating material between the individual islands. Individual of the gate lines are operatively adjacent a channel region (e.g., 30) of individual of the transistors within the individual islands and interconnect the transistors in that row. The individual transistors comprise a pair of source/drain regions (e.g., 34, 36) on opposite sides of the individual gate lines in the individual islands. A lower portion (e.g., 50) of the individual islands proximate individual of the bottoms of the insulating material has less horizontal area than an uppermost portion (e.g., 52) of the individual islands. Any other attribute(s) or aspect(s) as shown and/or described herein with respect to other embodiments may be used.

An embodiment of the invention comprises an array (e.g., 10, 10a, 10b) of recessed access devices (e.g., 25) regardless of whether comprising part of existing or future-developed memory or other circuitry. Such an array comprises islands (e.g., 16, 16a, 16b) comprising semiconductive material (e.g., 12) surrounded by insulating material (e.g., 15, and regardless in some embodiments of whether such insulating material has a bottom adjacent individual of the islands). Rows (e.g., 21) of transistor gate lines (e.g., 22) individually cross multiple of the islands within the semiconductive material and cross within the insulating material between individual of the islands. Individual of the gate lines are operatively adjacent a channel region (e.g., 30) of individual of the transistors within the individual islands and interconnect the transistors in that row. The individual transistors comprise a pair of source/drain regions (e.g., 34, 36) on opposite sides of the individual gate lines in the individual islands. The individual gate lines have a maximum vertical thickness (e.g., $T_1$) within the islands that is greater than a maximum vertical thickness (e.g., $T_2$) within the insulating material between the islands. Any other attribute(s) or aspect(s) as shown and/or described herein with respect to other embodiments may be used.

Structure of the above-described embodiments may be fabricated using any existing and/or future-developed technique(s). One example method of doing so with respect to the structure of FIGS. 1-6 is largely next-described with reference to FIGS. 11-25 with respect to predecessor constructions 8. Like-numerals have been used as described above and/or shown in FIGS. 1-6 for predecessor constructions and materials.

Figure 11:
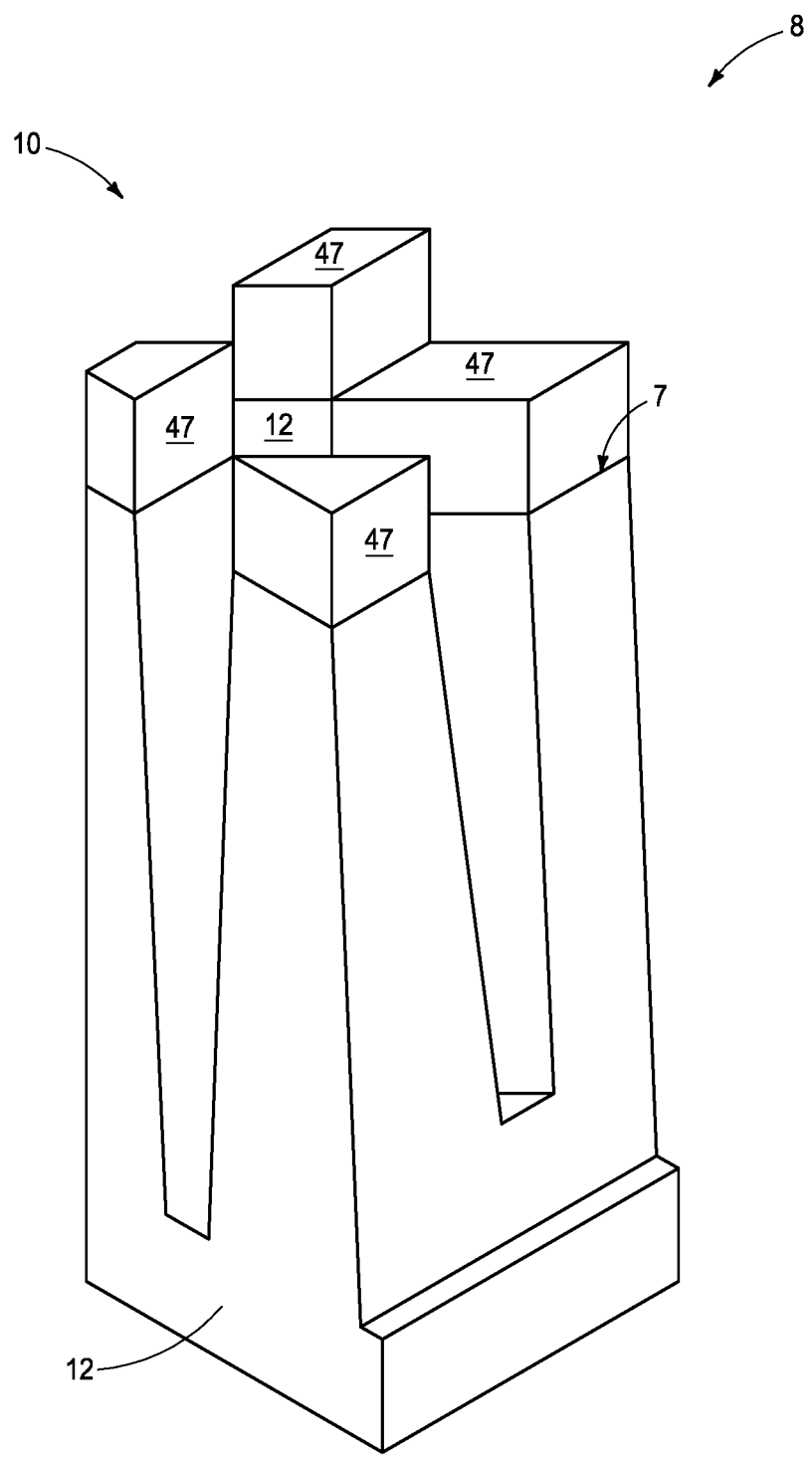
FIG. 11 is a view of a predecessor construction to that of FIG. 1 in an example method of forming the construction as shown in FIG. 1.

Referring to FIG. 11, a masking layer 47 (e.g., $Si_3N_4$ of 50 nanometer thickness) has been formed over one main surface 7 of semiconductor substrate material 12 (e.g., p-type silicon), and a line- and space pattern has been formed (e.g., at 40 nanometer pitch), for example using photolithography with or without pitch multiplication. Anisotropic etching has then been conducted of semiconductor material 12 to form the depicted trenches (e.g., of 250 nanometer depth) in semiconductor material 12. Such example trenches are narrower at their respective bases/bottoms than at their tops adjacent the one main surface of semiconductor material 12. Likewise, semiconductor material 12 surrounded by the trenches is wider deeper adjacent the bases/bottoms of the trenches than at their tops adjacent the one main surface of material 12.

Figure 12:
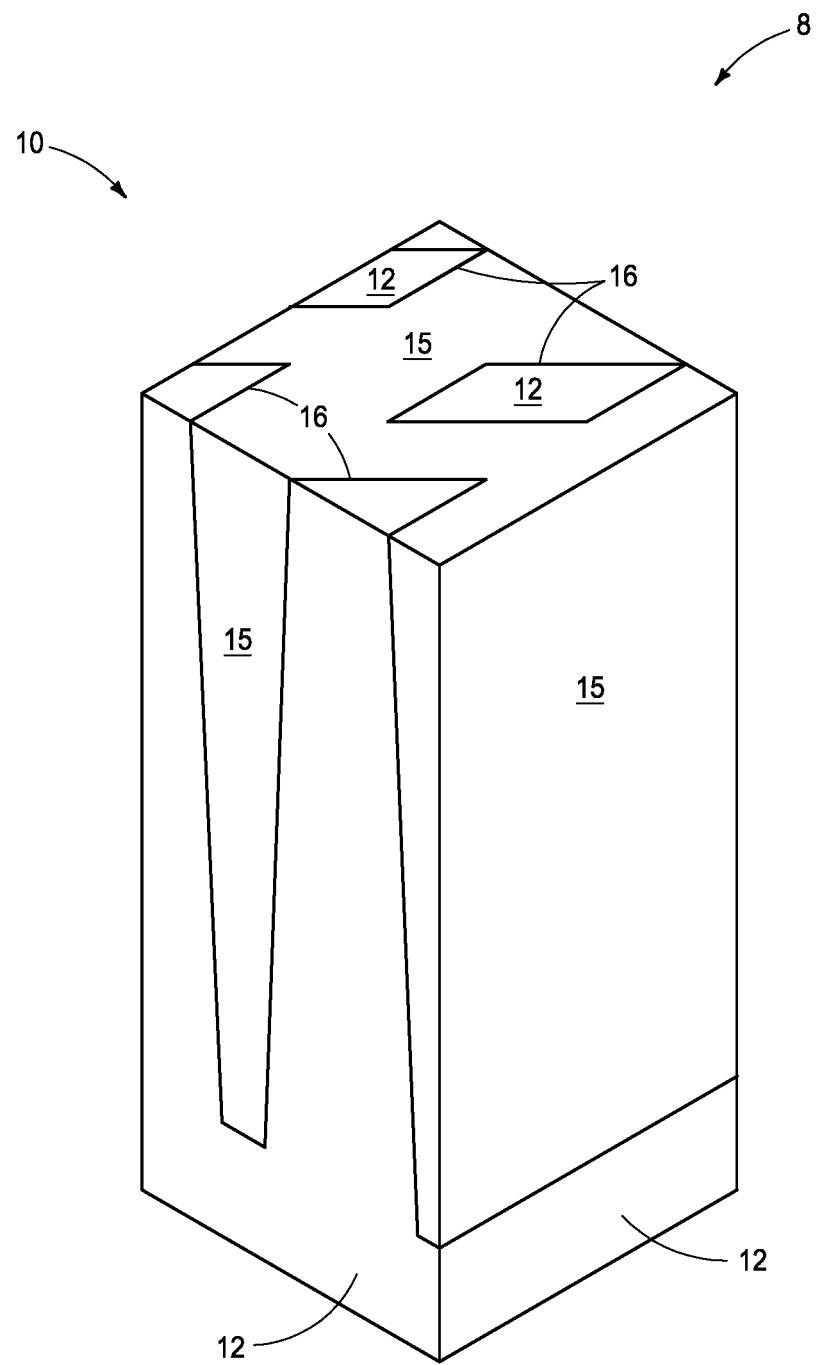
FIG. 12 is a view of the FIG. 11 construction at a processing step subsequent to that shown by FIG. 11.

Referring to FIG. 12, the trenches have been filled with insulator material 15 followed by removal of masking layer 47 (not shown), thereby showing effective formation of active area islands 16.

Figure 13:
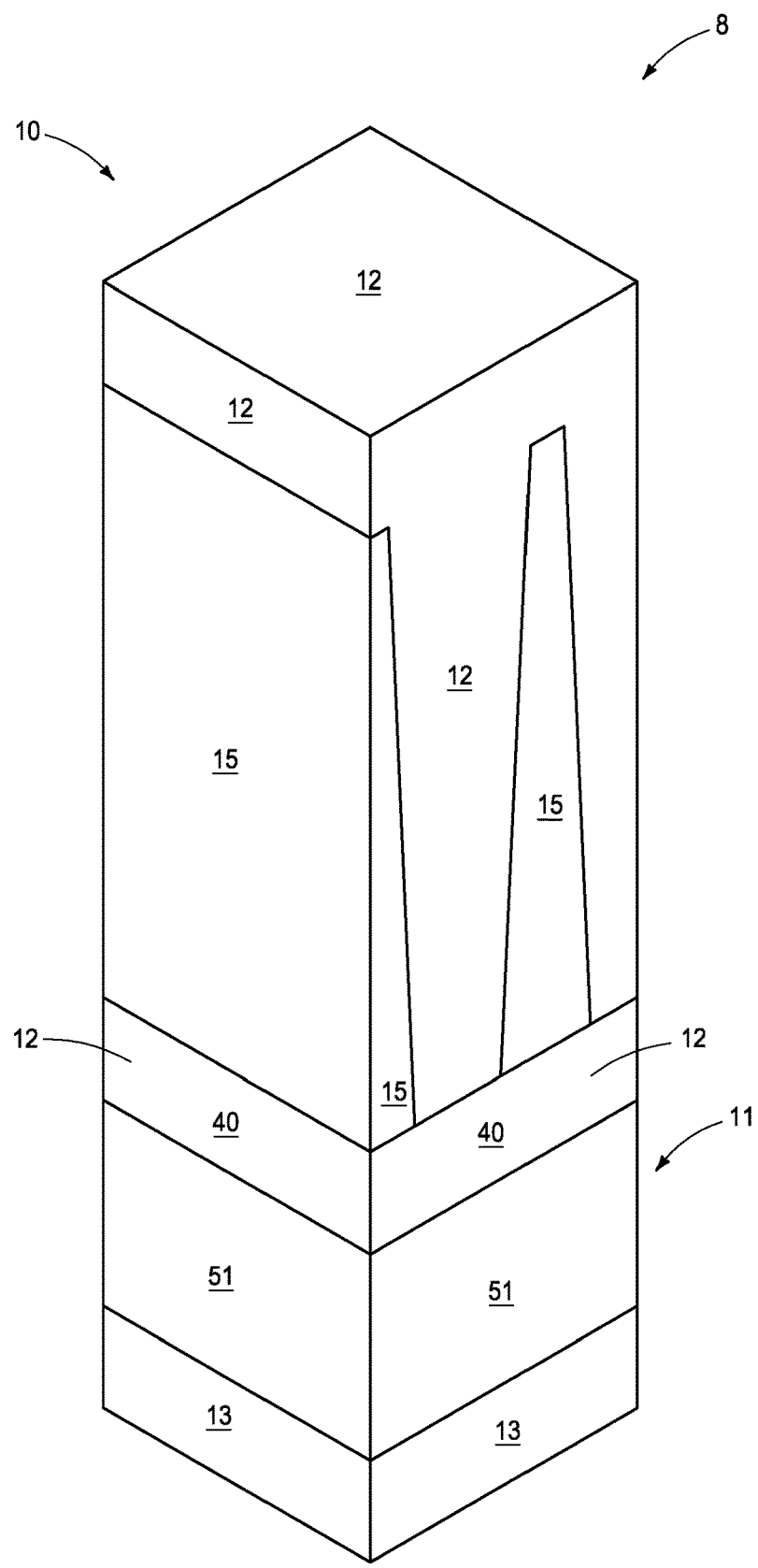
FIG. 13 is a view of the FIG. 12 construction at a processing step subsequent to that shown by FIG. 12.

Referring to FIG. 13, semiconductive material 40 (e.g., phosphorous-doped polysilicon) has been deposited atop the substrate construction 8 as shown in FIG. 12, followed by deposition of an insulator material 51 (e.g., $SiO_2$). Such a substrate construction 8 has then been flipped/inverted and bonded to another substrate 13 using any existing or future-developed technique not particularly germane to this disclosure (materials 40, 51, and 13 thereby effectively becoming base substrate 11 referred to above).

Figure 14:
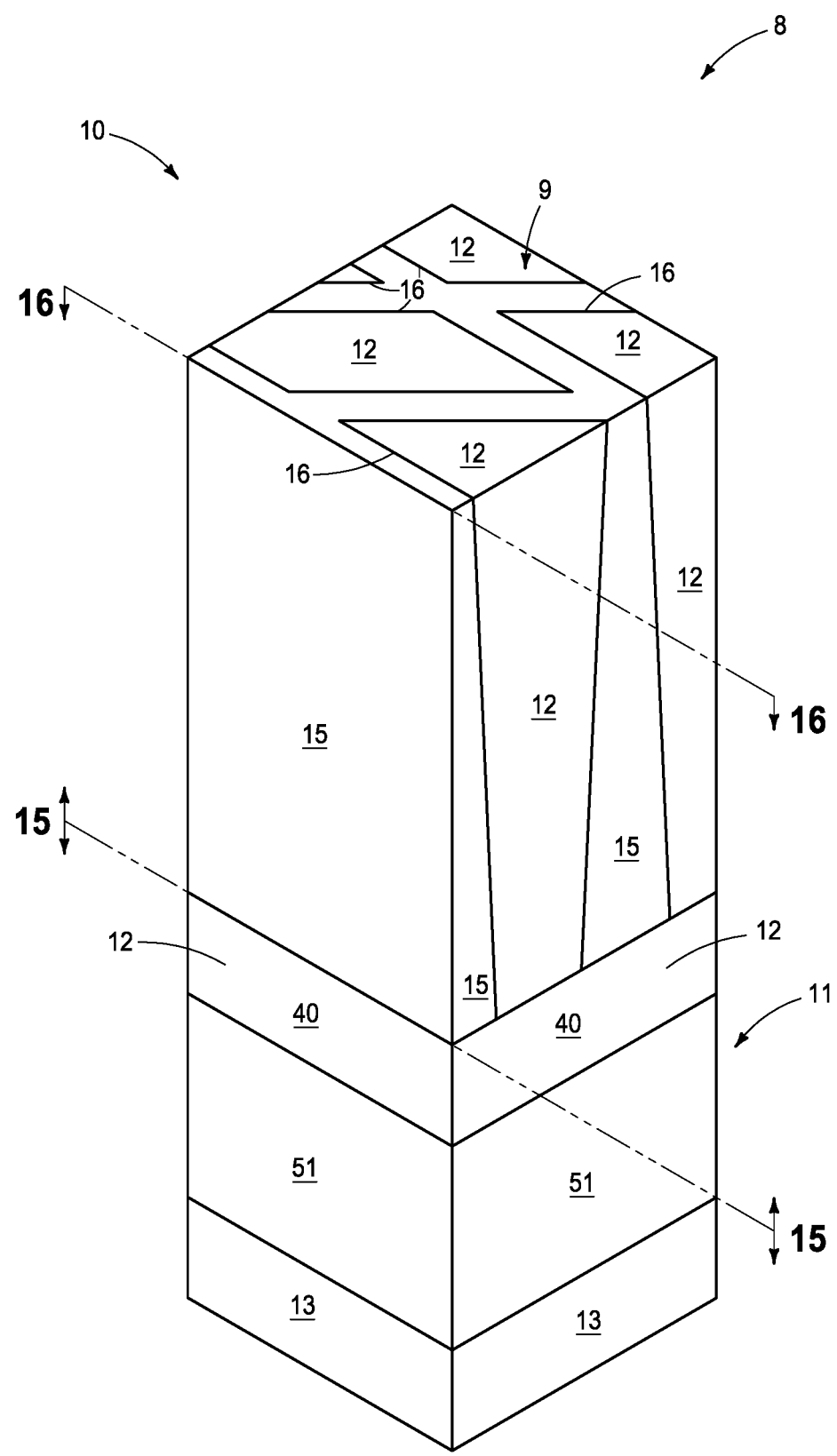
FIG. 14 is a view of the FIG. 13 construction at a processing step subsequent to that shown by FIG. 13.
Figure 15:
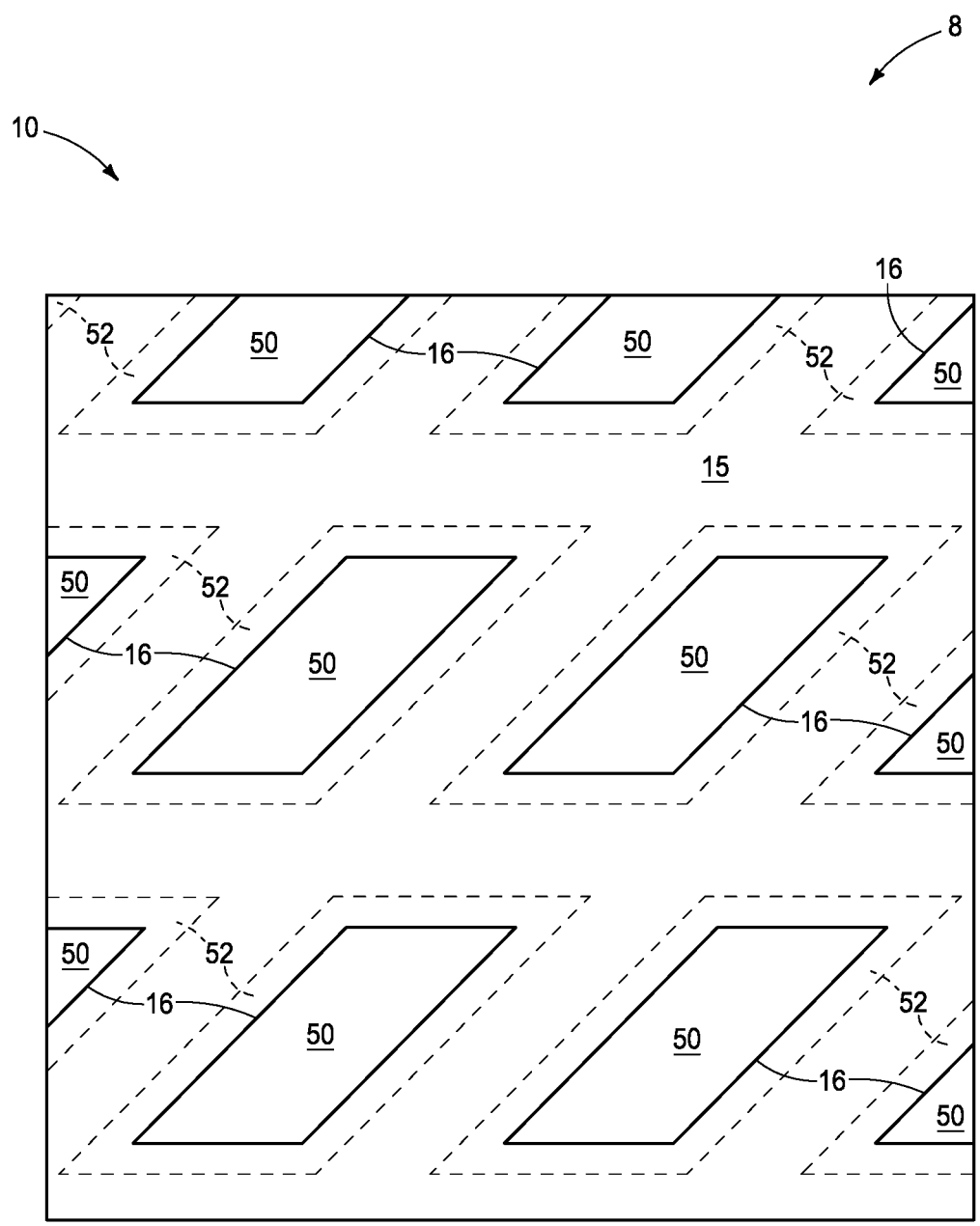
FIG. 15 is a view taken through line 15-15 in FIG. 14.
Figure 16:
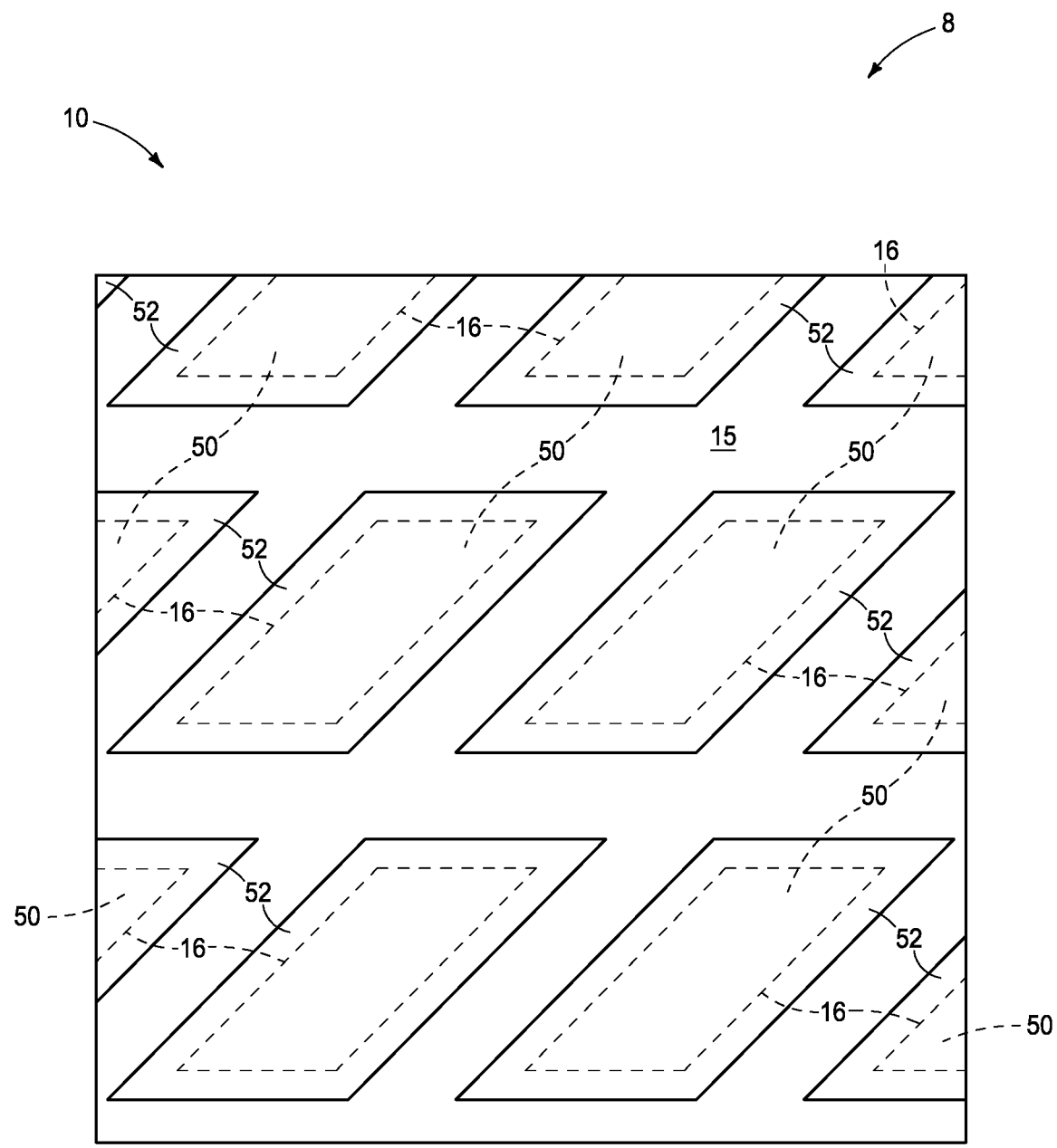
FIG. 16 is a view taken through line 16-16 in FIG. 14.

Referring to FIGS. 14-16, material has been removed from the opposite main surface 9 of construction 8, for example to provide construction 8 to have 250 nanometer thickness, thus exposing insulator material 15. Thus, the shapes and horizontal area relationships of portions 50 and 52 referred to above result as shown. Ion implanting or diffusion doping may be conducted, for example to convert a surface portion of construction 8 from p-type to n-type, for example to form LDD region of the memory cell transistors being formed.

Figure 17:
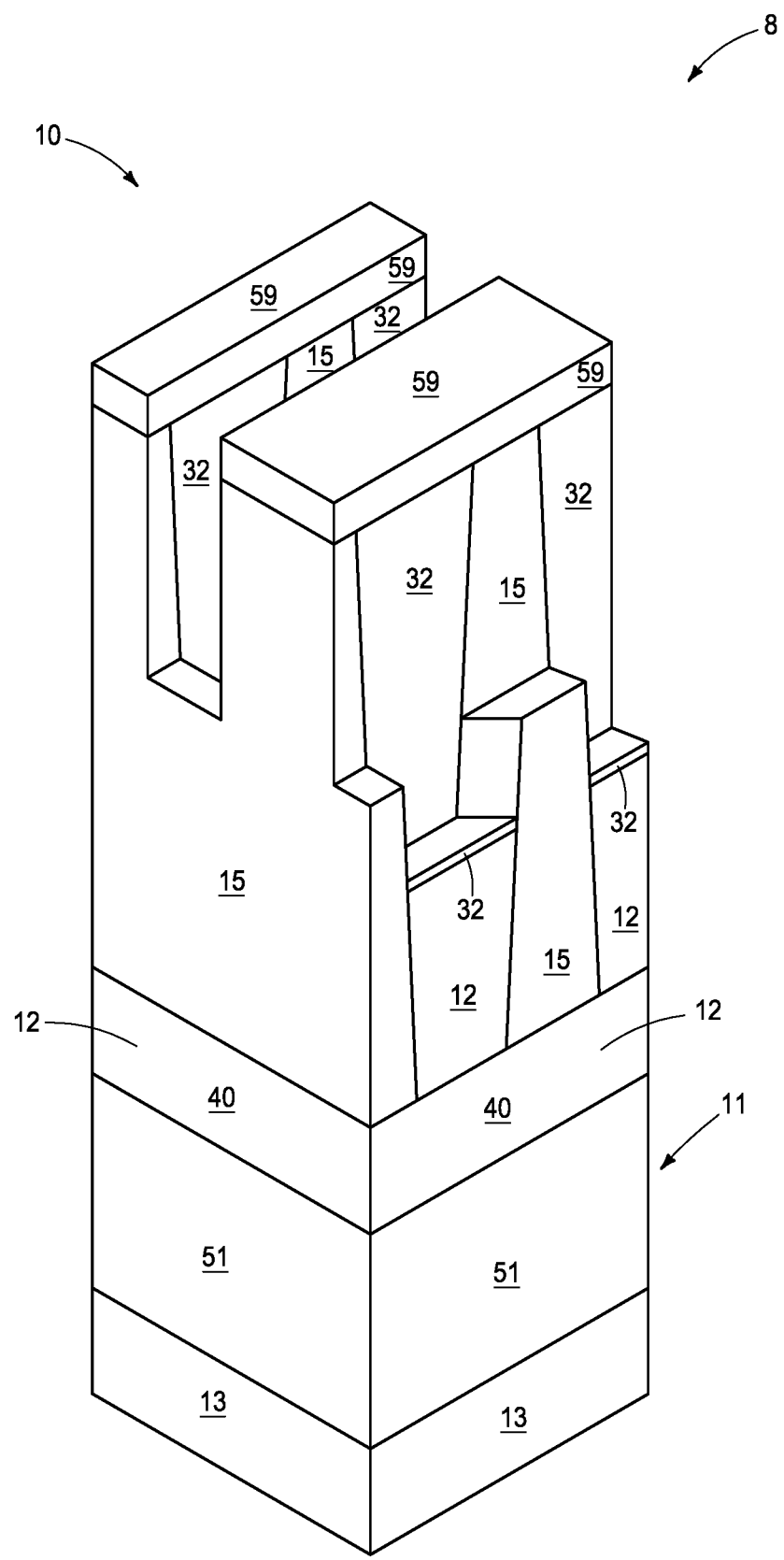
FIG. 17 is a view of the FIG. 14 construction at a processing step subsequent to that shown by FIG. 14.
Figure 18:
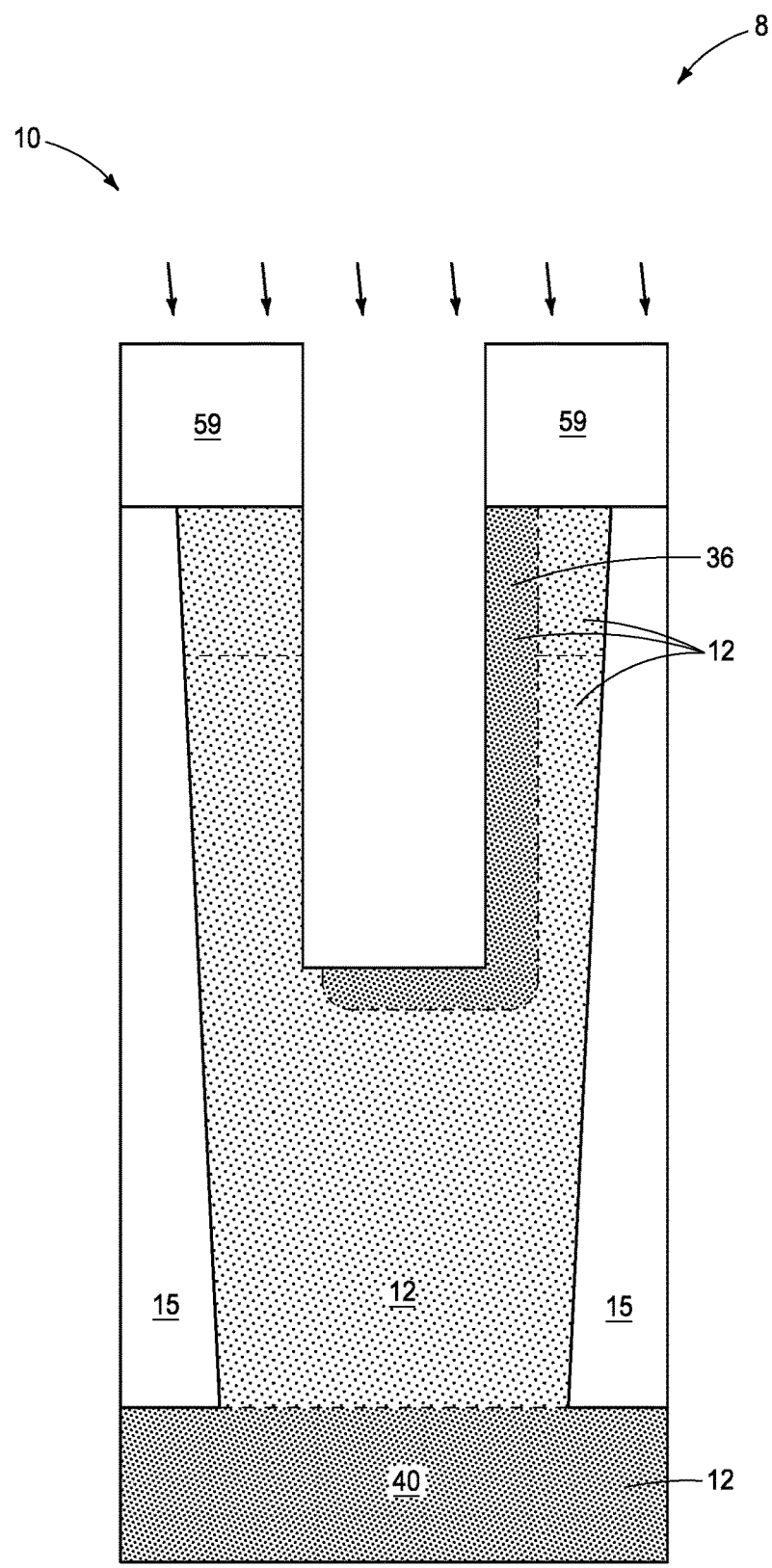
FIG. 18 is an enlarged sectional view of a portion of the FIG. 17 construction.
Figure 19:
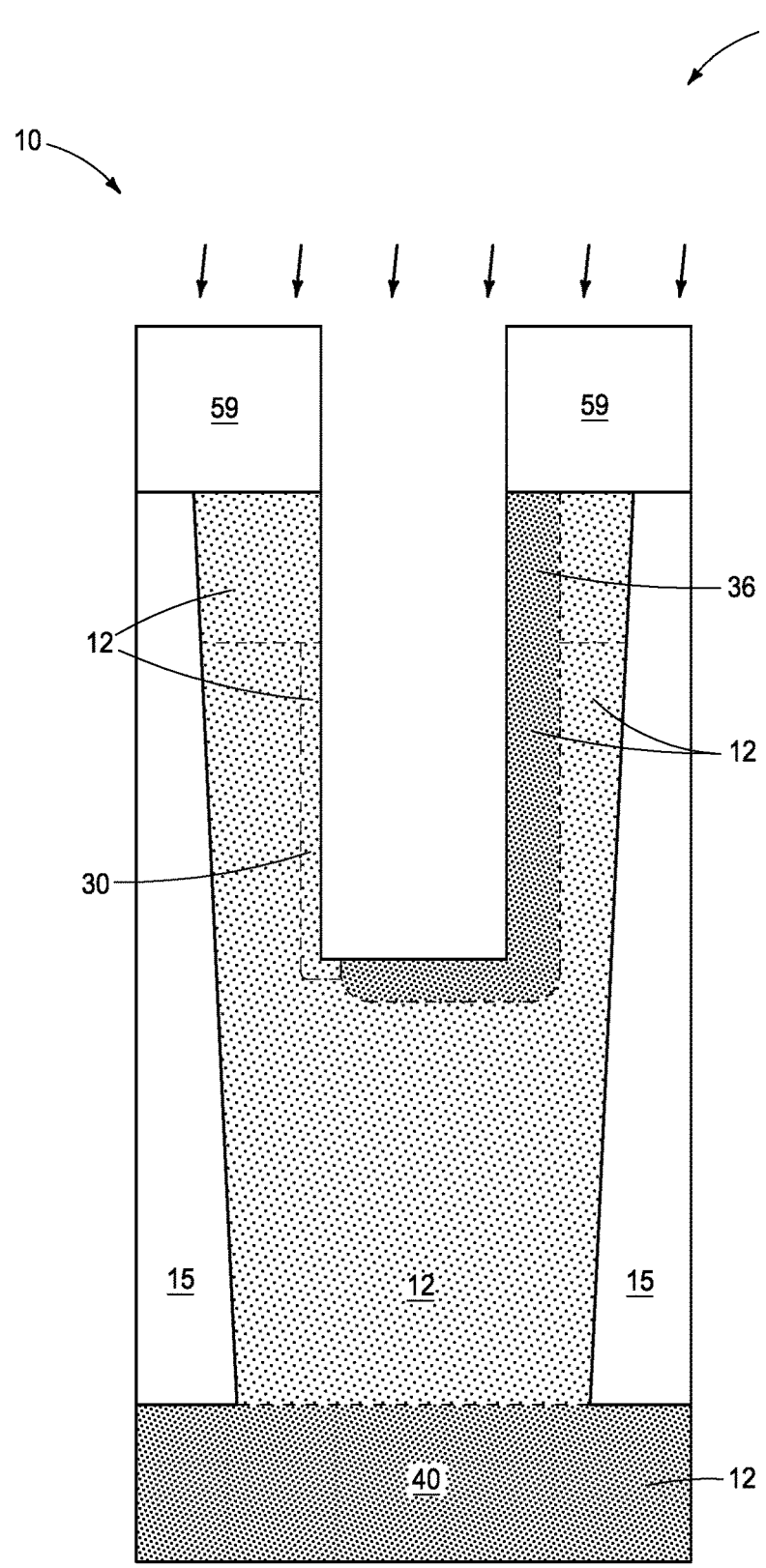
FIG. 19 is a view of the FIG. 18 construction at a processing step subsequent to that shown by FIG. 18.

Referring to FIG. 17, anisotropic etching has been conducted using appropriate masking material 59 to form the example depicted wordline trenches. Conventional etching conditions may be selected which etch the semiconductor material 12 (e.g., silicon) at a higher rate than that of insulator material 15 (e.g., silicon dioxide) whereby, for example, semiconductor material 12 is removed to a depth of about 200 nanometers and insulator material 15 is removed to a depth of about 150 nanometers. Annealing can be subsequently performed to form gate insulator 32. Before such annealing, an angled implant may be conducted as shown by FIG. 18 to form source/drain regions 36, followed by an alternate angled implant as shown by FIG. 19 to forming channel regions 30.

Figure 20:
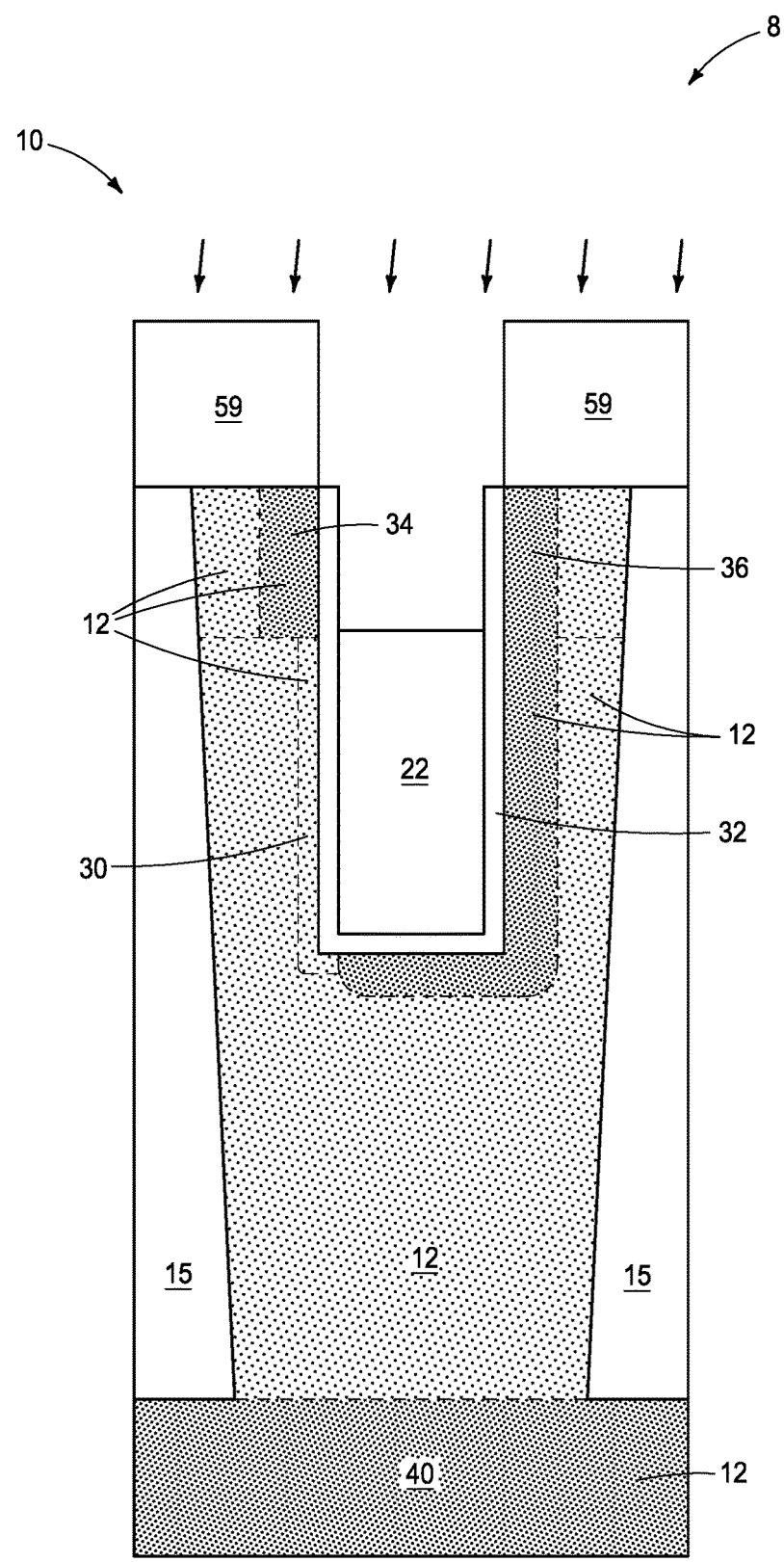
FIG. 20 is a view of the FIG. 19 construction at a processing step subsequent to that shown by FIG. 19.

Referring to FIG. 20, conductive material of wordlines 22 has been deposited to fill the trenches, and thereafter etched back as shown. An angled implant can then be carried out to form source/drain regions 34.

Figure 21:
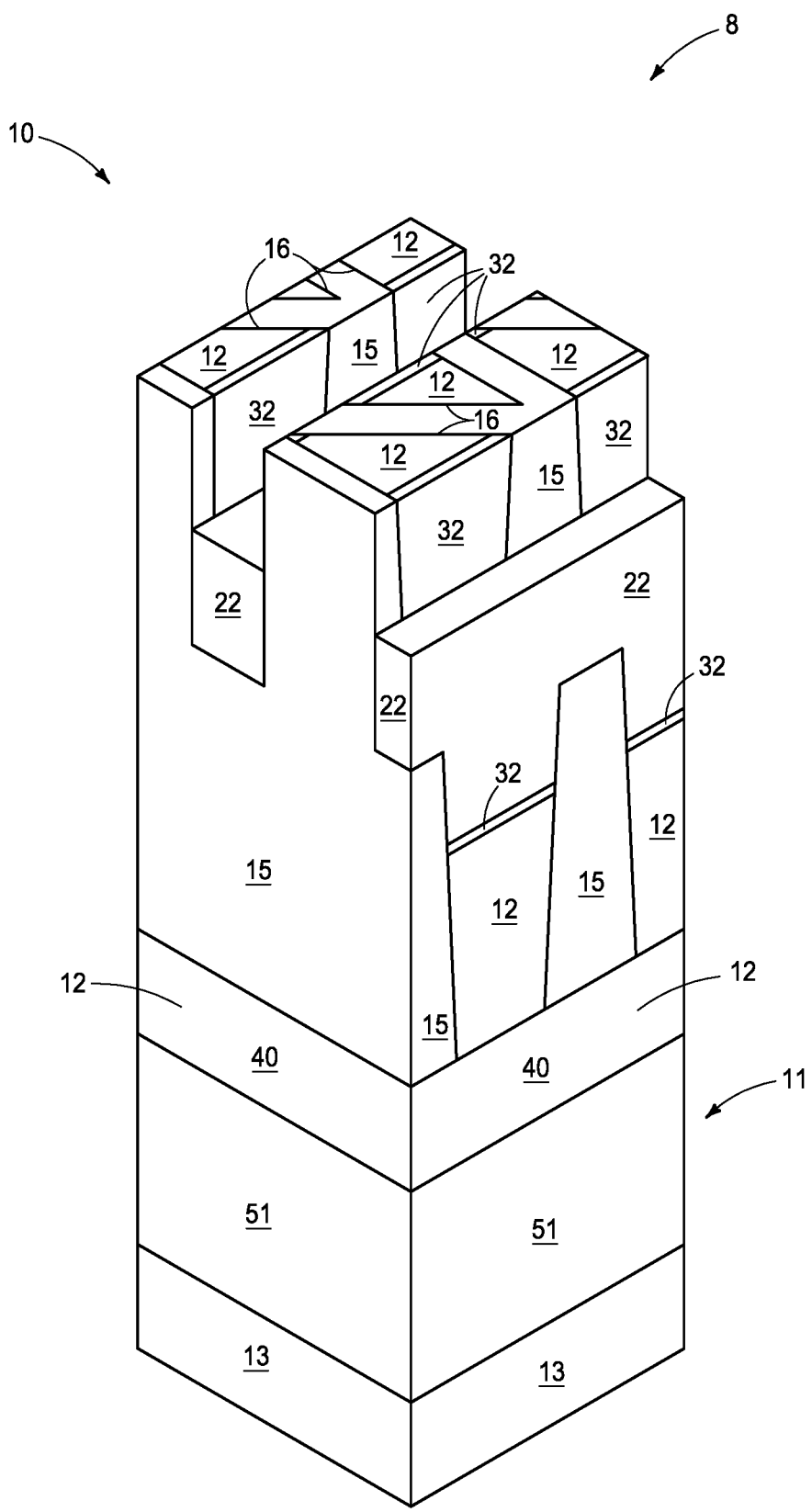
FIG. 21 is a view of the FIG. 17 construction at a processing step subsequent to that shown by FIG. 17.

Referring to FIG. 21, masking material 59 (not shown) has been removed.

Figure 22:
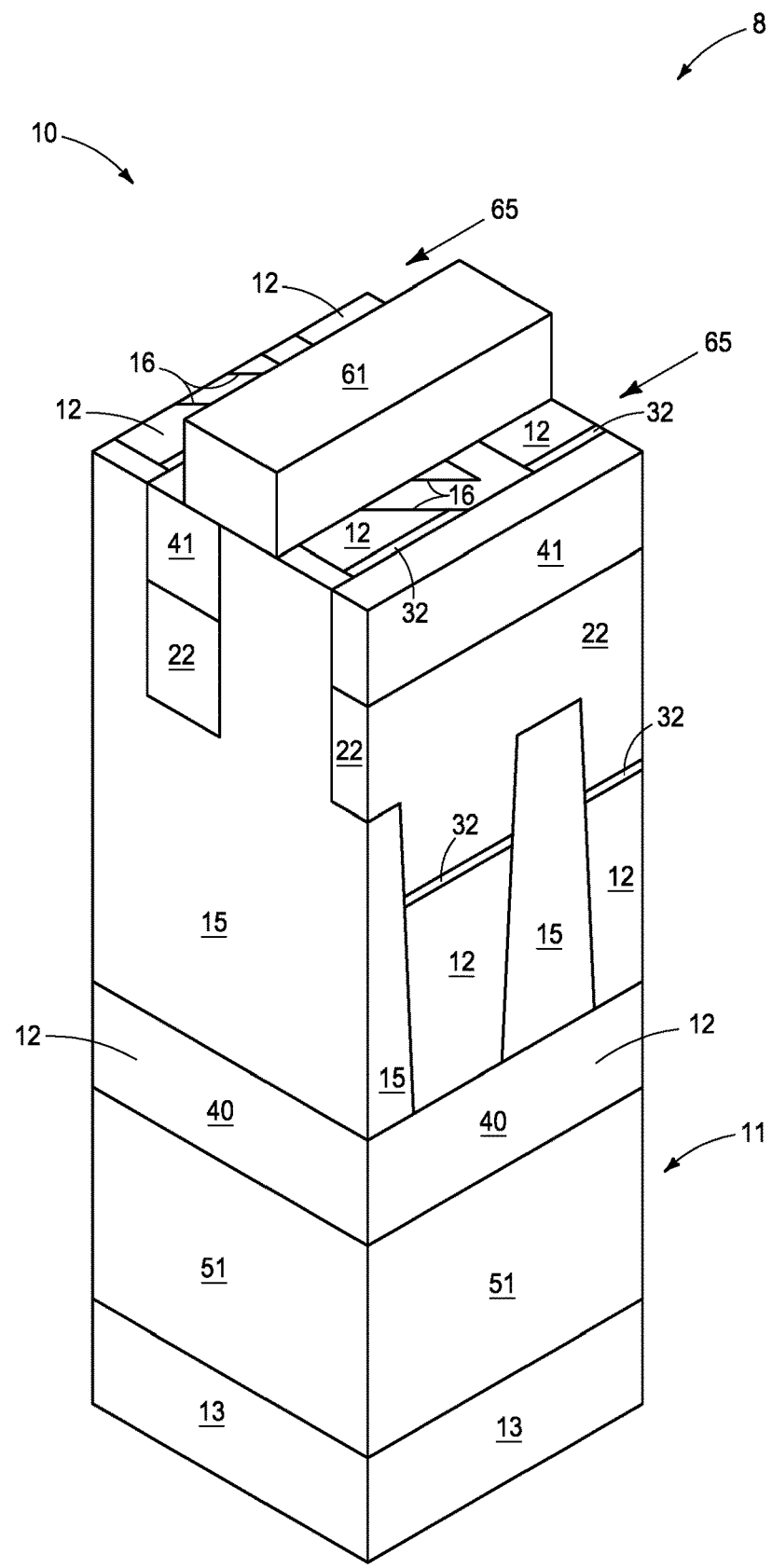
FIG. 22 is a view of the FIG. 21 construction at a processing step subsequent to that shown by FIG. 21.

Referring to FIG. 22, wordlines 22 have been covered with insulative material 41, followed by planarizing such back as shown. An interlayer insulating material 61 has been deposited and subjected to a line-and-space patterning to form bit contact trenches 65.

Figure 23:
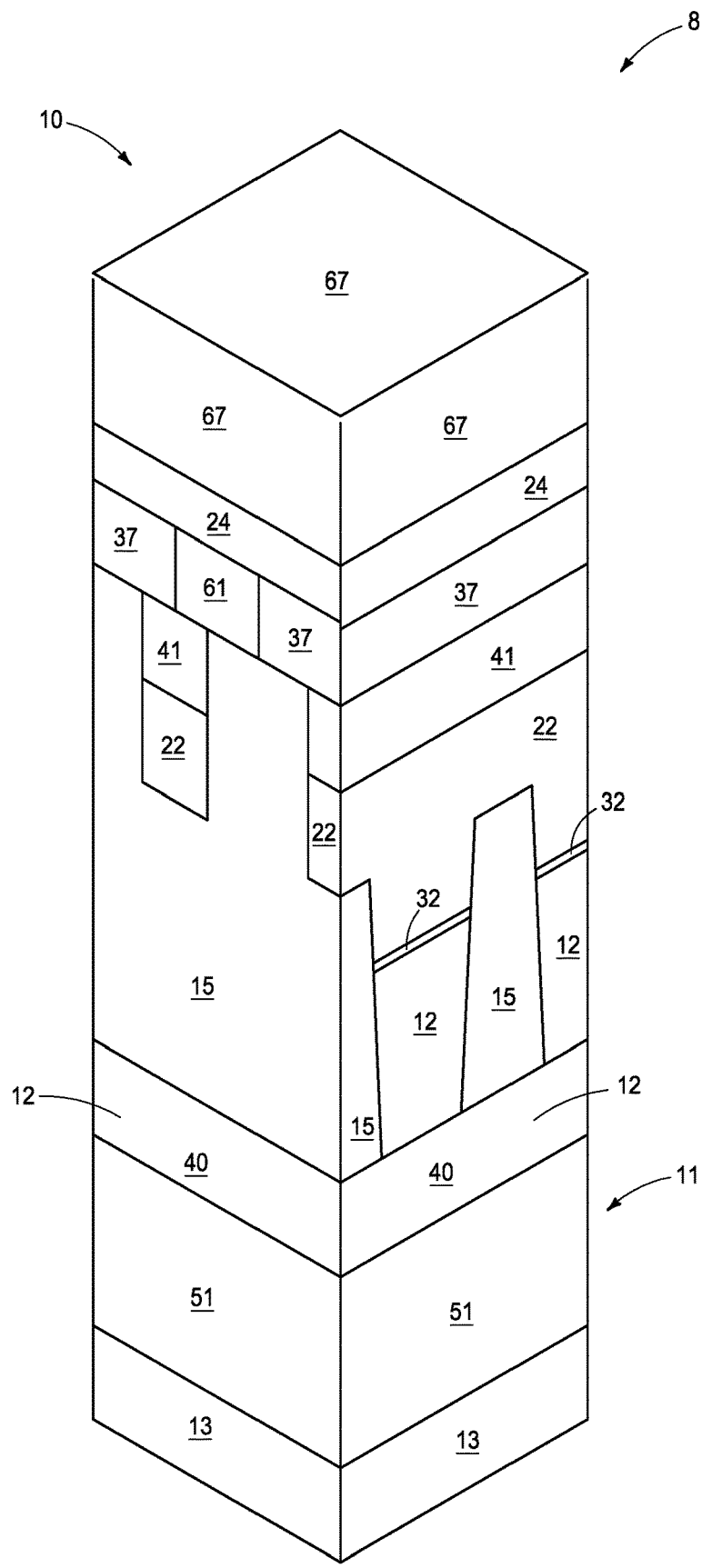
FIG. 23 is a view of the FIG. 22 construction at a processing step subsequent to that shown by FIG. 22.

Referring to FIG. 23, conductive materials 37 and 24 have been deposited, followed by deposition of an insulator material 67 thereover.

Figure 24:
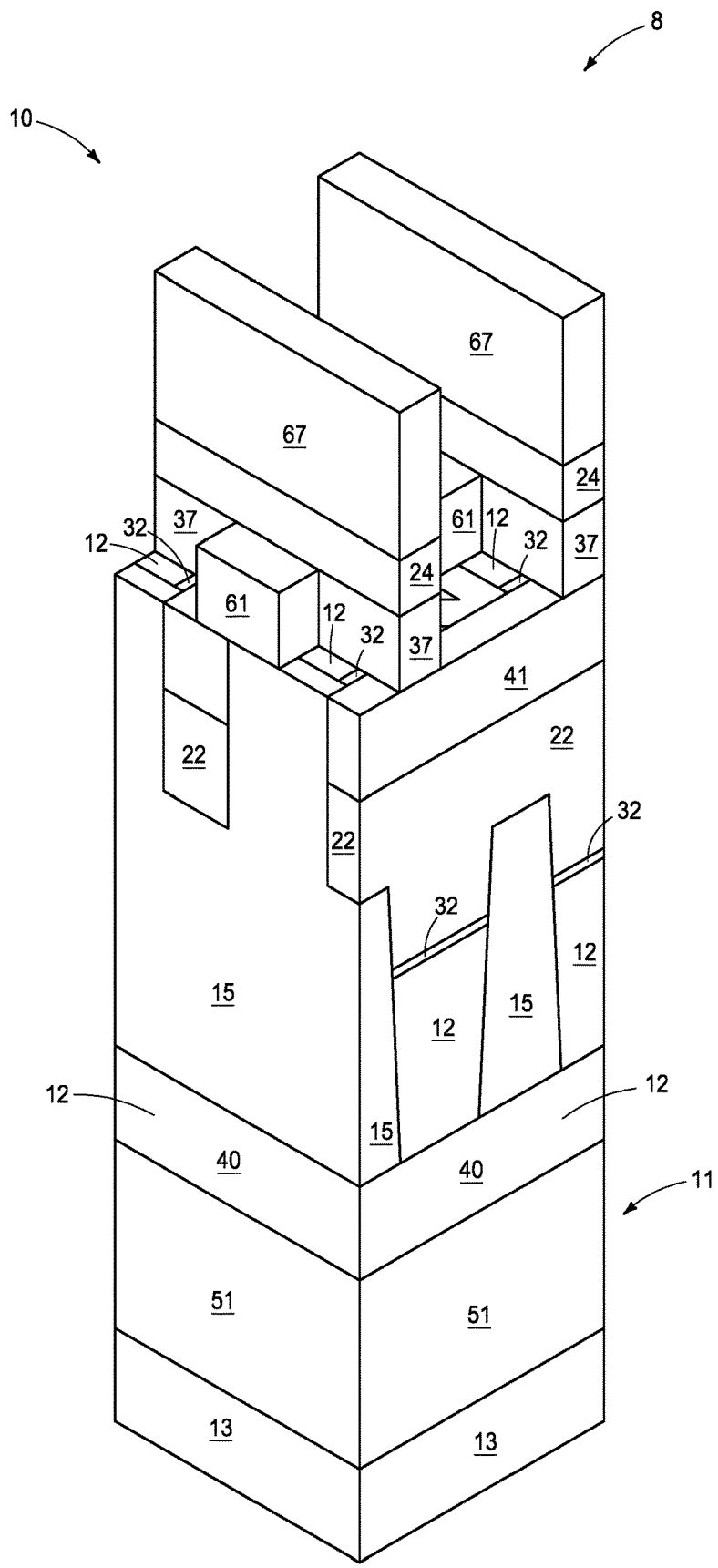
FIG. 24 is a view of the FIG. 23 construction at a processing step subsequent to that shown by FIG. 23.

Referring to FIG. 24, line- and space patterning has occurred whereby digitlines 24 and conductive vias 37 have been effectively formed.

Figure 25:
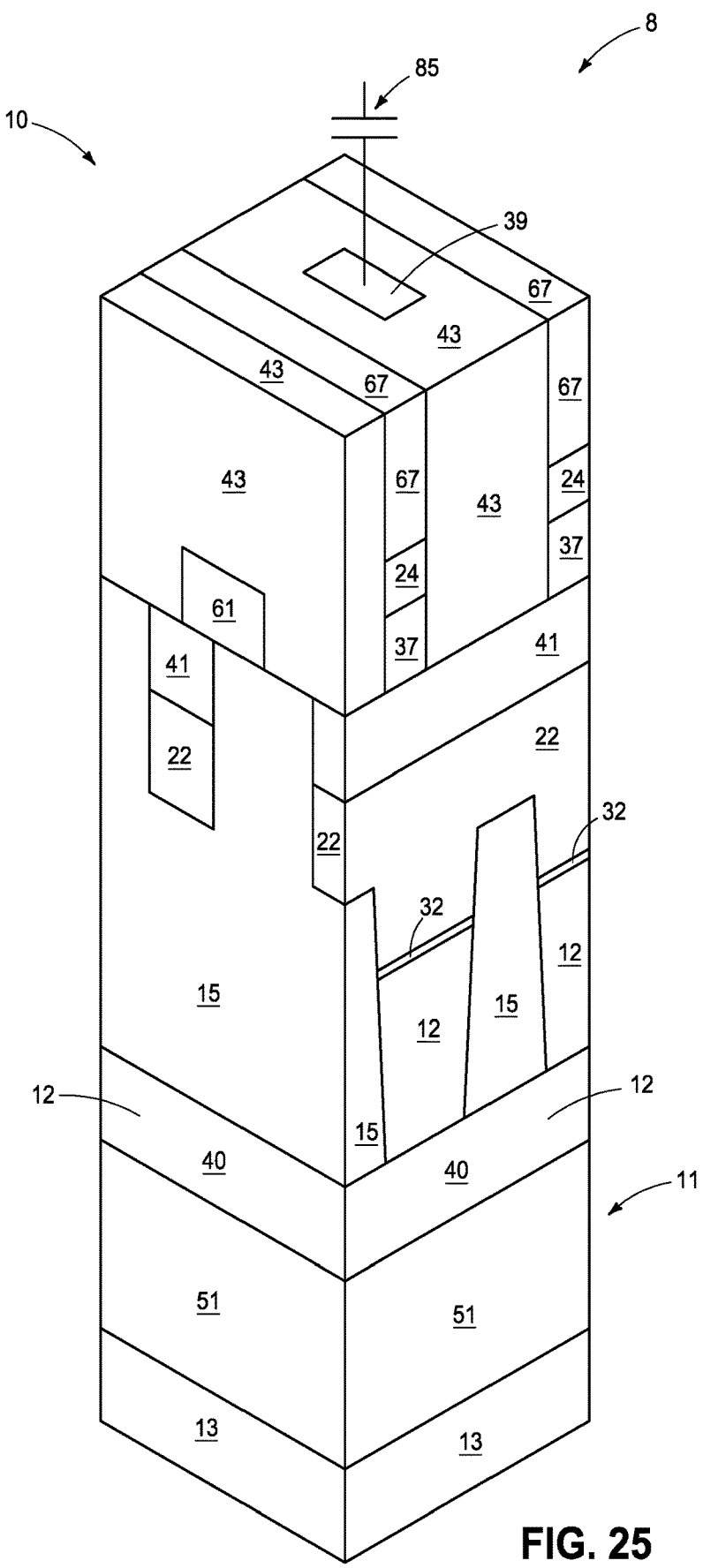
FIG. 25 is a view of the FIG. 24 construction at a processing step subsequent to that shown by FIG. 24.

FIG. 25 shows example subsequent processing wherein the spaces between adjacent digitlines 24 are filled with insulative material 43. Openings are formed therethrough and filled with conductive material 39 which is planarized back to form conductive vias 39 which are a part of or connect with a subsequently-formed capacitor 85.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, an array of recessed access devices comprises islands comprising semiconductive material surrounded by insulating material. The insulating material has a bottom adjacent individual of the islands. Rows of transistor gate lines individually cross multiple of the islands within the semiconductive material and cross within the insulating material between the individual islands. Individual of the gate lines are operatively adjacent a channel region of individual of the transistors within the individual islands and interconnect the transistors in that row. The individual transistors comprise a pair of source/drain regions on opposite sides of the individual gate lines in the individual islands. A lower portion of the individual islands proximate individual of the bottoms of the insulating material has less horizontal area than an uppermost portion of the individual islands.

In some embodiments, an array of recessed access devices comprises islands comprising semiconductive material surrounded by insulating material. Rows of transistor gate lines individually cross multiple of the islands within the semiconductive material and cross within the insulating material between individual of islands. Individual of the gate lines are operatively adjacent a channel region of individual of the transistors within the individual islands and interconnect the transistors in that row. The individual transistors comprise a pair of source/drain regions on opposite sides of the individual gate lines in the individual islands. The individual transistor gate lines have a maximum vertical thickness within the islands that is greater than a maximum vertical thickness within the insulating material between the islands.

In some embodiments, an array of memory cells individually comprise a capacitor and a transistor. The array comprises rows of wordlines and columns of digitlines. The array comprises islands comprising semiconductive material surrounded by insulating material. The insulating material has a bottom adjacent individual of the islands. Individual of the rows comprise a wordline crossing multiple of the islands within the semiconductive material and crossing within the insulating material between the individual islands. Individual of the wordlines are operatively adjacent a channel region of individual of the transistors within the individual islands and interconnect the transistors in that row. Individual of the columns comprise a digitline above the wordlines. The digitline are electrically coupled to one source/drain region of the individual transistors and interconnect the transistors in that column. Capacitors of the individual memory cells individually comprise a lower electrode electrically coupled to the other source/drain region of the individual transistors, an upper electrode, and a capacitor insulator between the lower and upper electrodes. The array comprises at least one of (a) and (b), where: (a): a lower portion of the individual islands proximate individual of the bottoms of the insulating material has less horizontal area than an uppermost portion of the individual islands, and (b): the individual wordlines have a maximum vertical thickness within the islands that is greater than a maximum vertical thickness within the insulating material between the islands.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of recessed access devices, comprising:
    islands comprising semiconductive material surrounded by insulating material, the insulating material having a bottom adjacent individual of the islands;
    rows of transistor gate lines individually crossing multiple of the islands within the semiconductive material and crossing within the insulating material between the individual islands, individual of the gate lines being operatively adjacent a channel region of individual of the transistors within the individual islands and interconnecting the transistors in that row, the individual transistors comprising a pair of source/drain regions on opposite sides of the individual gate lines in the individual islands; and
    a lower portion of the individual islands proximate individual of the bottoms of the insulating material having less horizontal area than an uppermost portion of the individual islands.

2. The array of claim 1 wherein the individual transistor gate lines have a maximum vertical thickness within the islands that is greater than a maximum vertical thickness within the insulating material between the islands.

3. The array of claim 1 wherein the pair of source/drain regions and the channel region are monocrystalline.

4. The array of claim 1 wherein the semiconductive material interconnects the islands below the bottoms of the insulating material.

5. The array of claim 4 wherein the semiconductive material that interconnects the islands below the bottoms of the insulating material is polycrystalline.

6. The array of claim 5 wherein the polycrystalline semiconductive material that interconnects the islands below the bottoms of the insulating material is conductively doped.

7. The array of claim 1 wherein,
the pair of source/drain regions and the channel region are monocrystalline; and
the semiconductive material interconnects the islands below the bottoms of the insulating material, the semiconductive material that interconnects the islands below the bottoms of the insulating material being polycrystalline.

8. The array of claim 7 wherein the polycrystalline semiconductive material that interconnects the islands below the bottoms of the insulating material is conductively doped.

9. The array of claim 1 wherein one of the source/drain regions of the pair is along all of one of the opposite sides of the individual gate lines in the individual islands.

10. The array of claim 1 wherein the channel region is along all of one of the opposite sides of the individual gate lines in the individual islands.

11. The array of claim 1 wherein,
one of the source/drain regions of the pair is along all of one of the opposite sides of the individual gate lines in the individual islands; and
the channel region is along all of the other of the opposite sides of the individual gate lines in the individual islands.

12. An array of recessed access devices, comprising:
islands comprising semiconductive material surrounded by insulating material;
rows of transistor gate lines individually crossing multiple of the islands within the semiconductive material and crossing within the insulating material between individual of the islands, individual of the gate lines being operatively adjacent a channel region of individual of the transistors within the individual islands and interconnecting the transistors in that row, the individual transistors comprising a pair of source/drain regions on opposite sides of the individual gate lines in the individual islands; and
the individual transistor gate lines having a maximum vertical thickness within the islands that is greater than a maximum vertical thickness within the insulating material between the islands.

13. The array of claim 12 wherein the insulating material has a bottom adjacent individual of the islands, the semiconductive material interconnecting the islands below the bottoms of the insulating material.

14. The array of claim 12 wherein one of the source/drain regions of the pair is along all of one of the opposite sides of the individual gate lines in the individual islands.

15. The array of claim 12 wherein the channel region is along all of one of the opposite sides of the individual gate lines in the individual islands.

16. An array of memory cells individually comprising a capacitor and a transistor, the array comprising rows of wordlines and columns of digitlines, comprising:
islands comprising semiconductive material surrounded by insulating material, the insulating material having a bottom adjacent individual of the islands;
individual of the rows comprising a wordline crossing multiple of the islands within the semiconductive material and crossing within the insulating material between the individual islands, individual of the wordlines being operatively adjacent a channel region of individual of the transistors within the individual islands and interconnecting the transistors in that row;
individual of the columns comprising a digitline above the wordlines, the digitline being electrically coupled to one source/drain region of the individual transistors and interconnecting the transistors in that column;
capacitors of the individual memory cells individually comprising a lower electrode electrically coupled to the other source/drain region of the individual transistors, an upper electrode, and a capacitor insulator between the lower and upper electrodes; and
at least one of (a) and (b), where:
(a): a lower portion of the individual islands proximate individual of the bottoms of the insulating material has less horizontal area than an uppermost portion of the individual islands; and
(b): the individual wordlines have a maximum vertical thickness within the islands that is greater than a maximum vertical thickness within the insulating material between the islands.

17. The array of claim 16 comprising one and only one memory cell per island.

18. The array of claim 16 comprising two and only two memory cells per island.

19. The array of claim 18 wherein the two memory cells in the individual islands share the one source/drain region.

20. The array of claim 16 comprising (a).

21. The array of claim 16 comprising (b).

22. The array of claim 16 comprising (a) and (b).

23. The array of claim 16 wherein the memory cells are DRAM cells.

24. The array of claim 23 wherein the DRAM cells are 1T-1C.

25. A memory device comprising:
a semiconductive substrate;
a semiconductive active region surrounded by isolation material to include an upper portion, a lower portion and a side surface merging the upper portion and the lower portion, the side surface being tapered from the upper portion to the lower portion so that the upper portion has more horizontal area than the lower portion;
bonding material between the lower portion and the semiconductive substrate to bond the active region over the semiconductive substrate;
a trench crossing the upper portion to divide the upper portion into first and second parts;
a wordline within the trench;
a digitline passing over the trench with an electrical coupling with the first part; and
a storage element in an electrical coupling with the second part.

26. The memory device of claim 25 further comprising conductive material between the lower portion and the bonding material with an electrical coupling with the lower portion.

27. The memory device of claim 26 wherein the semiconductive active region comprises monocrystalline semiconductive material and the conductive material comprises polycrystalline semiconductive material.

* * * * *